(12) United States Patent
Yeum et al.

(10) Patent No.: US 11,114,021 B2
(45) Date of Patent: Sep. 7, 2021

(54) DISPLAY DEVICE, METHOD OF MANUFACTURING THE SAME, AND GLASS STACK

(71) Applicant: Samsung Display Co., Ltd., Yongin-si (KR)

(72) Inventors: Jong Hoon Yeum, Seoul (KR); Go Woon Kang, Cheonan-si (KR); Yun Ho Kim, Hwaseong-si (KR); Jeung Soo Kim, Gwangju-si (KR); Youn Bum Lee, Cheonan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/374,164

(22) Filed: Apr. 3, 2019

(65) Prior Publication Data

US 2019/0311671 A1 Oct. 10, 2019

(30) Foreign Application Priority Data

Apr. 4, 2018 (KR) .................. 10-2018-0039066

(51) Int. Cl.
*G09G 3/30* (2006.01)
*G09G 3/22* (2006.01)
(Continued)

(52) U.S. Cl.
CPC .............. *G09G 3/22* (2013.01); *C03C 17/32* (2013.01); *C03C 27/10* (2013.01); *G02B 5/3025* (2013.01);
(Continued)

(58) Field of Classification Search
CPC ......... C03C 17/32; C03C 27/10; G05B 33/04; G02B 5/3025; G06F 3/0412;
(Continued)

(56) References Cited

U.S. PATENT DOCUMENTS 6,887,577 B1 * 5/2005 Keller ............... B32B 17/10605
428/436
9,490,309 B2 11/2016 Kuwabara
(Continued)

FOREIGN PATENT DOCUMENTS

| EP | 1814178 A2 | 8/2007 |
| KR | 10-0685812 B1 | 2/2007 |
| KR | 10-1331582 B1 | 9/2013 |
| KR | 10-2014-0128595 A | 11/2014 |

OTHER PUBLICATIONS

Extended European Search Report corresponding to European Patent Application No. 19167021.5 dated Sep. 10, 2019 8 pages.

*Primary Examiner* — Jennifer T Nguyen
(74) *Attorney, Agent, or Firm* — Innovation Counsel LLP

(57) ABSTRACT

Provided are a display device, a method of manufacturing the same, and a glass stack. The display device includes a light emitting substrate which comprises a base and a light emitting element disposed on the base; an encapsulation substrate which is disposed on the light emitting substrate; a frit which surrounds the light emitting element and is disposed between the light emitting substrate and the encapsulation substrate; and a first coating layer which is disposed between the encapsulation substrate and the frit, and comprises a compound having an intramolecular *—($OCH_2CH_2$)—OH structure, and at least partially contacting the frit.

19 Claims, 23 Drawing Sheets

(51) Int. Cl.
*G02B 5/30* (2006.01)
*G06F 3/041* (2006.01)
*H01L 51/52* (2006.01)
*C03C 17/32* (2006.01)
*C03C 27/10* (2006.01)

(52) U.S. Cl.
CPC ........ *G06F 3/0412* (2013.01); *H01L 51/5237* (2013.01); *H01L 51/5246* (2013.01)

(58) Field of Classification Search
CPC ... H01L 51/5237; H01L 51/524; H01L 27/32; H01L 27/3276; H01L 27/3218; H01L 51/5246; G09G 3/2003; G09G 3/22
USPC ............................ 345/76, 204; 313/504, 512
See application file for complete search history.

(56) References Cited

U.S. PATENT DOCUMENTS

| | | | |
|---|---|---|---|
| 2003/0064198 A1* | 4/2003 | Thomsen | B08B 17/065 428/172 |
| 2003/0066311 A1* | 4/2003 | Li | C03C 27/06 65/43 |
| 2009/0206739 A1 | 8/2009 | Lee et al. | |
| 2009/0261341 A1* | 10/2009 | Choi | H01L 51/5243 257/72 |
| 2011/0159773 A1* | 6/2011 | Jung | H01L 51/5246 445/25 |
| 2017/0047391 A1* | 2/2017 | You | H01L 29/78606 |
| 2019/0097169 A1* | 3/2019 | Gai | H01L 51/5246 |

* cited by examiner

DISPLAY DEVICE, METHOD OF MANUFACTURING THE SAME, AND GLASS STACK

This application claims the benefit of Korean Patent Application No. 10-2018-0039066, filed on Apr. 4, 2018, in the Korean Intellectual Property Office, the disclosure of which is incorporated herein by reference in its entirety.

BACKGROUND

1. Field

The present disclosure relates to a display device, a method of manufacturing the same, and a glass stack.

2. Description of the Related Art

With the development of multimedia, display devices are becoming increasingly important. Accordingly, various display devices such as liquid crystal displays and organic light emitting diode displays are being developed.

For example, an organic light emitting display includes a base and an organic light emitting element disposed on the base. The organic light emitting element may include two opposite electrodes and an organic light emitting layer interposed between the two opposite electrodes. Electrons and holes provided from the two electrodes may be recombined in the organic light emitting layer to generate excitons, and the generated excitons may emit light as they change from an excited state to a ground state. The organic light emitting layer of the organic light emitting element is vulnerable to damage by moisture or air.

As one way to suppress the damage of the organic light emitting layer due to external moisture or air, a method of placing an encapsulation substrate on a light emitting substrate including a light emitting element and then bonding the light emitting substrate and the encapsulation substrate together using a frit material may be exemplified.

There is a limit in improving the bond strength between an encapsulation substrate and a frit. For example, when an impact is applied from the outside of a display device, a bonding surface between the encapsulation substrate and the frit may be damaged. If the bonding surface between the encapsulation substrate and the frit is damaged, penetration of moisture, air, or the like from the outside may be allowed, thereby reducing the durability of an organic light emitting element.

SUMMARY

Aspects of the present disclosure provide a display device having improved bond strength between an encapsulation substrate and a frit.

Aspects of the present disclosure also provide a method of manufacturing a display device, the method being employed to improve the bond strength between an encapsulation substrate and a frit.

Aspects of the present disclosure also provide a glass stack having improved bond strength.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a display device includes a light emitting substrate which comprises a base and a light emitting element disposed on the base; an encapsulation substrate which is disposed on the light emitting substrate; a frit which surrounds the light emitting element and is disposed between the light emitting substrate and the encapsulation substrate; and a first coating layer which is disposed between the encapsulation substrate and the frit, and comprises a compound having an intramolecular *—(OCH$_2$CH$_2$)—OH structure, and at least partially contacting the frit.

An embodiment of a glass stack includes a first glass piece; a second glass piece which is disposed on the first glass piece; and a coating layer which is interposed between the first glass piece and the second glass piece, contacts the first glass piece and the second glass piece, and comprises a compound having an intramolecular *—(OCH$_2$CH$_2$)—OH structure.

An embodiment of a method of manufacturing a display device includes preparing a light emitting substrate which comprises a base and a light emitting element disposed on the base; preparing an encapsulation substrate, on at least a portion of a surface of which a coating layer comprising a compound having an intramolecular *—(OCH$_2$CH$_2$)—OH structure is formed; forming a frit for bonding the light emitting substrate and the encapsulation substrate together between the light emitting substrate and the encapsulation substrate to at least partially contact the coating layer formed on the encapsulation substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
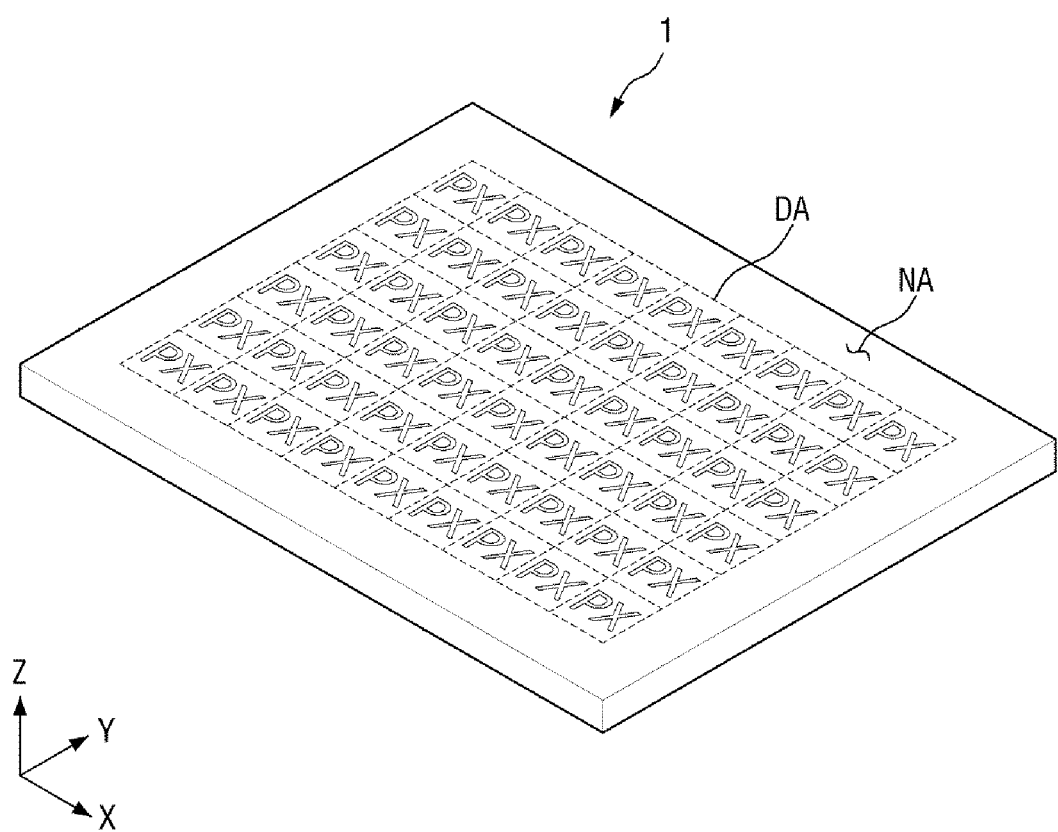
FIG. 1 is a perspective view of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

As used herein, a first direction X denotes any one direction in a plane, a second direction Y denotes a direction intersecting the first direction X in the plane, and a third direction Z denotes a direction perpendicular to the plane. Unless otherwise defined, 'plane' refers to a plane to which the first direction X and the second direction Y belong.

Hereinafter, embodiments will be described with reference to the accompanying drawings.

FIG. 1 is a perspective view of a display device 1 according to an embodiment.

Referring to FIG. 1, the display device 1 according to the current embodiment may include a display area DA and a non-display area NA.

The display area DA may be an area contributing to substantial image display by including a plurality of pixels PX. As used herein, 'pixels' refer to single regions into which the display area DA is divided for color display in plan view, and one pixel may be a single region defined as a minimum unit that can express a color independently of other pixels. That is, each of the pixels PX may uniquely display one of predetermined primary colors to implement color display. Examples of the primary colors include red, green and blue. In plan view, the display area DA may be surrounded by the non-display area NA. The non-display area DA does not contribute to image display, and elements necessary for the operation of the display device 1 may be located in the non-display area NA.

Figure 2:
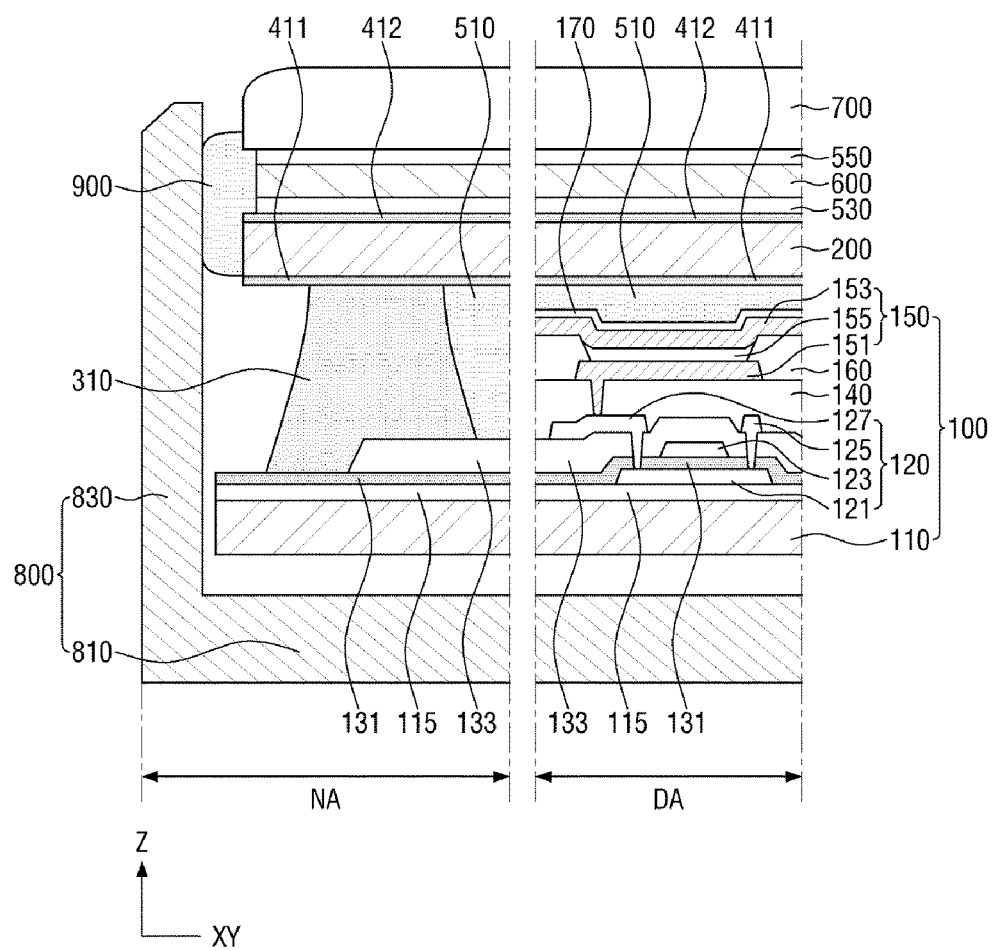
FIG. 2 is a cross-sectional view of a display area and a non-display area of the display device of FIG. 1.

The display device 1 according to the current embodiment will now be described in more detail by additionally referring to FIG. 2. FIG. 2 is a cross-sectional view of the display area DA and the non-display area NA of the display device 1 of FIG. 1, illustrating a region where a light emitting element 150 is disposed and a region where a frit 310 is disposed.

Referring to FIGS. 1 and 2, the display device 1 may include a light emitting substrate 100, an encapsulation substrate 200 and the frit 310 bonding the light emitting substrate 100 and the encapsulation substrate 200 together and may further include lower and upper coating layers 411 and 412 disposed on at least part of a surface of the encapsulating substrate 200.

The light emitting substrate 100 may include a base 110 and the light emitting element 150. The light emitting substrate 100 may include the light emitting element 150 capable of emitting light by itself to provide light required for image display. For example, the light emitting substrate 100 may be a display substrate including the light emitting element 150 disposed in each pixel PX. The light emitting elements 150 respectively disposed in the pixels PX may emit light independently of each other, thereby realizing image display and color display.

The base 110 may be a transparent or opaque insulating substrate or film. For example, the base 110 may include a glass material or a quartz material or may include a polymer material such as polyimide, polycarbonate, polyethylene terephthalate or polyacrylate.

A buffer layer 115 may be disposed on a surface (an upper surface in FIG. 2) of the base 110. The buffer layer 115 may protect the base 110 and prevent impurities such as moisture or air from penetrating and damaging the light emitting element 150. In addition, the buffer layer 115 may prevent the base 110 from being damaged in the process of forming an active layer 121 which will be described later. The buffer layer 115 may be disposed over the display area DA and the non-display area NA. The buffer layer 115 may include an inorganic material such as silicon nitride (SiNx), silicon oxide (SiOx), or silicon nitride oxide (SiNxOy, SiOxNy). In an embodiment, the buffer layer 115 may be omitted.

A thin-film transistor 120 and first and second insulating layers 131 and 133 may be disposed on the buffer layer 115.

The thin-film transistor 120 may be a driving transistor configured to control the amount of light emitted from the light emitting element 150 in a certain pixel PX by controlling the amount of current flowing through a channel region in the active layer 121 according to a signal transmitted to a control terminal. For example, the thin-film transistor 120 may include the active layer 121 that forms a channel, a gate 123 which is the control terminal, a drain 125 which is an input terminal, and a source 127 which is an output terminal.

The active layer 121 may be disposed on the buffer layer 115. The active layer 121 may include a semiconductor material. For example, the active layer 121 may include polycrystalline silicon. In an embodiment, the active layer 121 may include monocrystalline silicon or amorphous silicon or may include a non-silicon-based semiconductor material such as an oxide semiconductor. The active layer 121 may be partially conductive. For example, the active layer 121 may include a drain region and a source region spaced apart from each other by the channel region interposed between the drain region and the source region, and each of the drain region and the source region may have greater electrical conductivity than the channel region.

The gate 123 may be disposed on the active layer 121. The gate 123 may at least partially overlap the channel region of the active layer 121. The gate 123 may include aluminum (Al), molybdenum (Mo), copper (Cu), or an alloy of these materials. Although not illustrated in the drawings, the gate 123 may be electrically connected to an output electrode of a switching transistor (not illustrated) that controls ON/OFF of a certain pixel.

The first gate insulating layer 131 may be interposed between the active layer 121 and the gate 123 to insulate the active layer 121 and the gate 123 from each other. That is, the first insulating layer 131 may be a gate insulating layer. The first insulating layer 131 may be disposed over the display area DA and the non-display area NA. The first insulating layer 131 may include an inorganic insulating material such as silicon nitride, silicon oxide, or silicon nitride oxide.

The second insulating layer 133 may be disposed on the gate 123. The second insulating layer 133 may insulate the gate 123 from elements disposed on the gate 123. The second insulating layer 133 may be disposed over the display area DA and the non-display area NA. In some embodiments, the second insulating layer 133 may be a laminated structure of a plurality of insulating layers. The second insulating layer 133 may include an inorganic insulating material such as silicon nitride, silicon oxide, or silicon nitride oxide.

Through holes at least partially exposing the active layer 121 may be formed in the first insulating layer 131 and the second insulating layer 133. For example, the through holes may pass through the first insulating layer 131 and the second insulating layer 133 to at least partially expose the drain region and the source region of the active layer 121.

The drain 125 and the source 127 may be disposed on the second insulating layer 133. The drain 125 and the source 127 may be respectively inserted into the through holes to contact the active layer 121. Although not illustrated in the drawings, the drain 125 may be electrically connected to a driving voltage line (not illustrated) to receive a driving voltage, and the source 127 may be electrically connected to the light emitting element 150.

A step difference compensating layer 140 may be disposed on the drain 125 and the source 127. The step difference compensating layer 140 may minimize steps formed by elements such as the thin-film transistor 120, the switching transistor (not illustrated), auxiliary electrodes (not illustrated) and/or wirings (not illustrated) such as a scan line, a data line and the driving voltage line. That is, the step difference compensating layer 140 may be a planarizing layer that provides a space in which the light emitting element 150 can be stably disposed. The material of the step difference compensating layer 140 is not particularly limited as long as it has an insulating property and a planarizing property. For example, the step difference compensating layer 140 may include an organic or inorganic material such as acrylic resin, epoxy resin, imide resin, cardo resin, or ester resin.

The light emitting element 150 may be disposed on the step difference compensating layer 140. The light emitting element 150 may be disposed in each pixel PX. For example, the light emitting element 150 may be an organic light emitting element including an anode 151 and a cathode 153 which face each other and an organic light emitting layer 155 which is interposed between the anode 151 and the cathode 153. The light emitting element 150 may emit blue light, green light, red light, or white light depending on the material or the lamination structure of the organic light emitting layer 155.

The anode 151 may be disposed on the step difference compensating layer 140. The anode 151 may be electrically connected to the source 127 through a through hole penetrating the step difference compensating layer 140. In FIG. 2, etc., the anode 151 and the source 127 of the thin-film transistor 120 (i.e., the driving transistor) are in direct contact with each other and thus are directly connected to each other. However, the present disclosure is not limited to this case, and the anode 151 and the source 127 can be electrically connected by one or more thin-film transistors (not illustrated) or a connection electrode (not illustrated). The anode 151 may be a pixel electrode which is disposed in each pixel PX in the display area DA and to which an independent driving signal is transmitted. The anode 151 may be a transparent electrode, an opaque electrode, or a laminated structure of a transparent electrode and an opaque electrode. Examples of the material that forms the transparent electrode include indium tin oxide (ITO), indium zinc oxide (IZO), zinc oxide, and indium oxide. Examples of the material that forms the opaque electrode include lithium (Li), aluminum (Al), magnesium (Mg), silver (Ag), nickel (Ni), and chromium (Cr).

The cathode 153 may be disposed on the anode 151. The cathode 153 may be a common electrode disposed over or across a plurality of pixels PX without distinction between the pixels PX. That is, a plurality of light emitting elements 150 disposed in different pixels PX may share the cathode 153 with each other. Like the anode 151, the cathode 153 may be a transparent electrode, an opaque electrode, or a laminated structure of a transparent electrode and an opaque electrode.

The organic light emitting layer 155 may be interposed between the anode 151 and the cathode 153. The organic light emitting layer 155 may emit light by recombining holes and electrons received from the anode 151 and the cathode 153. For example, electrons and holes may be recombined in the organic light emitting layer 155 to generate excitons, and the generated excitons may emit light as they change from an excited state to a ground state.

The organic light emitting layer 155 may include a material that can emit blue phosphorescent or fluorescent light having a peak wavelength in the range of about 430 nm to about 470 nm, a material that can emit green phosphorescent or fluorescent light having a peak wavelength in the range of about 530 nm to about 570 nm, or a material that can emit red phosphorescent or fluorescent light having a peak wavelength in the range of about 610 nm to about 650 nm. In FIG. 2, etc., the organic light emitting layer 155 is disposed in each pixel PX. However, the present disclosure is not limited to this case. In an embodiment, the organic light emitting layer 155 may be disposed over a plurality of pixels PX. That is, at least some of a plurality of light emitting elements 150 disposed in different pixels PX may share the organic light emitting layer 155 with each other.

Although not illustrated in the drawings, hole control assisting layers (not illustrated) such as a hole injection layer, a hole transport layer and a hole blocking layer, electron control assisting layers (not illustrated) such as an electron injection layer, an electron transport layer and an electron blocking layer, or a charge generation assisting layer (illustrated) may be further formed between the organic light emitting layer 155 and the anode 151 or between the organic light emitting layer 155 and the cathode 153 to improve the luminous efficiency of the light emitting element 150.

In some embodiments, a pixel defining layer 160 may be disposed on the anode 151. The pixel defining layer 160 may define each pixel PX in the display area DA. The pixel defining layer 160 may have an opening that partially exposes a surface of the anode 151. That is, in plan view, the pixel defining layer 160 may have an opening that exposes at least a portion of the anode 151 disposed in each pixel PX. The organic light emitting layer 155 and the cathode 153 described above may be disposed on the pixel defining layer 160. The pixel defining layer 160 may include an organic material such as acrylic resin, epoxy resin, imide resin, or ester resin.

The light emitting substrate 100 may further include a protective layer 170 disposed on the light emitting element 150. The protective layer 170 may be disposed directly on the light emitting element 150. For example, the protective layer 170 may be disposed directly on the cathode 153 of the light emitting element 150. Together with the encapsulation substrate 200 and the frit 310 which will be described later, the protective layer 170 may prevent impurities such as moisture or air from penetrating and damaging the light emitting element 150 or prevent the light emitting element 150 from being damaged by a filler 510 containing an organic material. That is, the protective layer 170 may perform an additional encapsulating function for the light emitting element 150. The protective layer 170 may be disposed over a plurality of pixels PX. The protective layer 170 may include an inorganic material such as silicon nitride, silicon oxide, or silicon nitride oxide.

Next, the encapsulation substrate 200 will be described. The encapsulation substrate 200 may be disposed on the light emitting substrate 100. The encapsulation substrate 200 may include a material that can prevent damage to the light emitting element 150 due to penetration of moisture or air. For example, the encapsulation substrate 200 may include a glass material or a quartz material.

In an embodiment, the surface of the encapsulation substrate 200 may be at least partially treated with fluorine. That is, fluorine groups (—F) may be present on the surface of the encapsulation substrate 200, specifically, the surface of the encapsulation substrate 200 which is in contact with the lower and upper coating layers 411 and 412 to be described later. In a non-limiting example, when the encapsulation substrate 200 includes a silicon-based glass material, fluorine groups bonded to silicon atoms may be present on the surface of the encapsulation substrate 200. The fluorine groups on the surface of the encapsulation substrate 200 may form a physical/chemical bond with compounds in the lower and upper coating layers 411 and 412 to contribute to the improvement of bond strength between the encapsulation substrate 200 and the frit 310.

The frit 310 and the lower and upper coating layers 411 and 412 of the display device 1 according to the current embodiment will now be described in detail by additionally referring to FIG. 3. As used herein, the term 'frit' refers not only to an additive-containing glass material in the form of a powder but also to a glass structure formed by melting and curing an additive-containing glass material in the form of a power.

Figure 3:
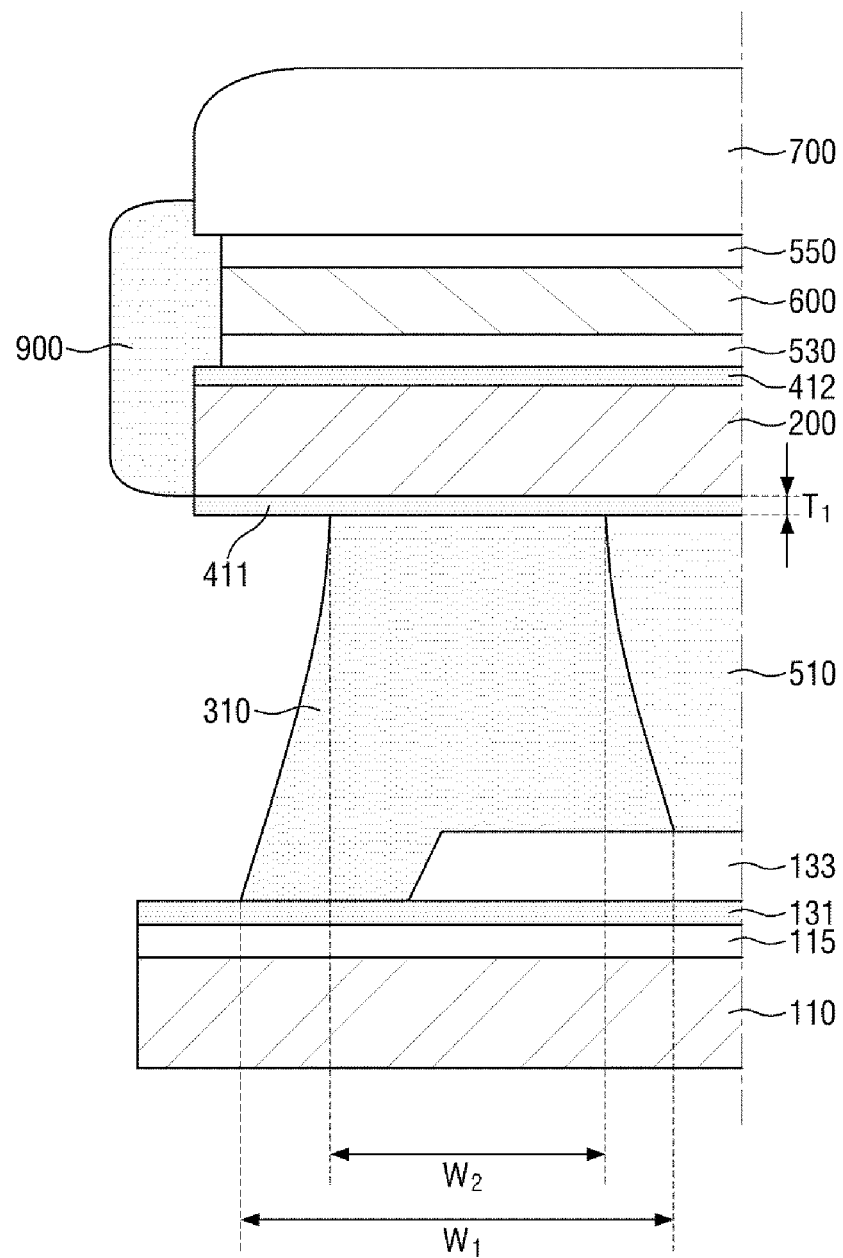
FIG. 3 is an enlarged cross-sectional view of the non-display area of display device of FIG. 2.

Referring to FIGS. 1 through 3, the frit 310 may be disposed between the light emitting substrate 100 and the encapsulation substrate 200. The frit 310 may be a sealing member for bonding the light emitting substrate 100 and the encapsulation substrate 200 together. The frit 310 may be a glass frit containing a glass material. The transmittance of the frit 310 may be smaller than the transmittance of the encapsulation substrate 200.

The frit 310 may be disposed in the non-display area NA and surround a plurality of light emitting elements 150. In plan view, the frit 310 may be shaped like, but not limited to, a substantially quadrilateral band. The frit 310 may be configured to completely encapsulate the light emitting element 150 together with the encapsulation substrate 200. Accordingly, the damage to the light emitting element 150 due to penetration of moisture or air can be prevented.

In some embodiments, the frit 310 may have inclined side surfaces. A lower width $W_1$ of the frit 310, for example, a width $W_1$ of the frit 310 on the side of the light emitting substrate 100 may be greater than an upper width $W_2$ of the frit 310, for example, a width $W_2$ of the frit 310 on the side of the encapsulation substrate 200. Alternatively, the lower width of the frit 310 may be smaller than the upper width of the frit 310, or the side surfaces of the frit 310 may not be inclined, but may be substantially perpendicular.

A lower surface of the frit 310 may contact the first insulating layer 131 and/or the second insulating layer 133 of the light emitting substrate 100. In FIGS. 2 and 3, the frit 310 contacts both the first insulating layer 131 and the second insulating layer 133 of the light emitting substrate 100. However, the present disclosure is not limited to this case. In an embodiment, the frit 310 may not contact the first insulating layer 131, may not contact the second insulating layer 133, or may contact the buffer layer 115 or the base 110. In addition, an upper surface of the frit 310 may contact the lower coating layer 411. The lower coating layer 411 will be described later.

The frit 310 may be formed by melting and curing a frit composition or frit paste. For example, the frit 310 may include vanadium oxide such as vanadium pentoxide ($V_2O_5$). The content of the vanadium oxide in the frit 310 may be, but is not limited to, about 30 mol % to about 50 mol %. In some embodiments, the frit 310 may further include a ceramic filler. In an embodiment, the frit 310 may include barium oxide, bismuth oxide, antimony oxide, borate, phosphate or borosilicate, in addition to vanadium oxide.

The lower coating layer 411 may be disposed between the frit 310 and the encapsulation substrate 200. For example, the lower coating layer 411 may be disposed directly on a back surface of the encapsulation substrate 200. The lower coating layer 411 may contact the frit 310 and the encapsulation substrate 200. The lower coating layer 411 may contribute to the improvement of bond strength between the frit 310 and the encapsulation substrate 200.

The lower coating layer 411 may be a coating layer formed by single molecules having a self-aligning property or a self-assembling property. That is, the lower coating layer 411 may be a self-aligned layer. For example, the lower coating layer 411 may be a self-aligned layer of a polyethylene glycol-based compound.

In an embodiment, the lower coating layer 411 may include a compound having an intramolecular *—$(OCH_2CH_2)_n$—* structure (where n is a natural number of 1 to 200) and may be a coating layer formed by self-alignment of the above compound. For example, the compound in the lower coating layer 411 may have an intramolecular *—$(OCH_2CH_2)_n$—OH structure or an intramolecular *—$(OCH_2CH_2)$—OH structure. In a more specific example, the compound in the lower coating layer 411 may have an R—$(OCH_2CH_2)_n$—OH structure, where R may be a $C_1$-$C_{50}$ alkyl group substituted with one or more hydroxyl groups. The self-aligned compound having the hydroxyl groups may form a physical/chemical bond with fluorine groups on the back surface of the encapsulation substrate 200. The lower coating layer 411 may have alkalinity. As used herein, 'alkalinity' denotes having a pH exceeding 7.

The lower coating layer 411 may be disposed over the display area DA and the non-display area NA. For example, the lower coating layer 411 may overlap the light emitting element 150 in the display area DA and the frit 310 in the non-display area NA in the third direction Z. In an embodiment, a thickness of the lower coating layer 411 may be approximately uniform. A maximum thickness $T_1$ of the lower coating layer 411 may be about 10 μm or less. When the maximum thickness $T_1$ of the lower coating layer 411 is about 10 μm or less, compounds in the lower coating layer 411 may be stably maintained in a self-aligned state.

In addition, the upper coating layer 412 may be disposed on a front surface of the encapsulation substrate 200. For example, the upper coating layer 412 may be disposed directly on the encapsulation substrate 200. The upper coating layer 412 may contribute to the improvement of bond strength between the encapsulation substrate 200 and a first bonding layer 530 to be described later. The upper coating layer 412 may include the same compound as the lower coating layer 411. For example, the upper coating layer 412 may be a self-aligned layer formed by self-alignment of the above-described compound having an intramolecular *—$(OCH_2CH_2)_n$—OH structure or an intramolecular *—$(OCH_2CH_2)$—OH structure. The self-aligned compound having the hydroxyl groups may form a physical/chemical bond with fluorine groups on the front surface of the encapsulation substrate 200.

Like the lower coating layer 411, the upper coating layer 412 may have alkalinity. In addition, the upper coating layer 412 may be disposed over the display area DA and the non-display area NA and may overlap the light emitting element 150 and the frit 310 in the third direction Z. A maximum thickness of the upper coating layer 412 may be, but is not limited to, about 10 μm or less.

In an embodiment, the filler 510 may be disposed between the encapsulation substrate 200 and the light emitting element 150. The filler 510 may minimize a step formed by the light emitting element 150, for example, a step formed by the pixel defining layer 160. In addition, the filler 510 may fill a space between the encapsulation substrate 200 and the light emitting substrate 100. Since the filler 510 minimizes a step difference between the encapsulation substrate 200 and the light emitting substrate 100 and fills the space between the encapsulation substrate 200 and the light emitting substrate 100, the mechanical strength or durability of the display device 1 can be improved. The filler 510 may at least partially contact the protective layer 170, the lower coating layer 411, and the frit 310. The material of the filler 510 is not particularly limited as long as it is a material having a planarizing property. For example, the filler 510 may include an organic material such as acrylic resin, epoxy resin, imide resin, or acrylate resin.

In an embodiment, the filler 510 may not be used or included between the encapsulation substrate 200 and the light emitting element 150, and the encapsulation substrate 200 and the light emitting element 150 may be spaced apart from each other. The space between the encapsulation substrate 200 and the light emitting element 150 may be filled with an inert gas such as nitrogen gas ($N_2$).

In some embodiments, the display device 1 may include a functional member 600 disposed on the encapsulation substrate 200, a cover glass 700 disposed on the functional member 600, a housing 800 accommodating the light emitting substrate 100 and the encapsulation substrate 200, and a cushion member 900 disposed on side surfaces of the encapsulation substrate 200.

The functional member 600 may be disposed on the front surface of the encapsulation substrate 200. The functional member 600 may have a polarizing function or a touch sensing function. That is, the functional member 600 may include a polarizing element or a touch sensing element.

The polarizing element may contribute to outdoor visibility by blocking the transmission of reflected light of external light or at least partially absorbing the reflected light. The polarizing element may be a linear polarizer that converts incident light into linearly polarized light or a circular polarizer that converts incident light into circularly polarized light.

In addition, the touch sensing element may sense information input to the display device 1 by a user of the display device 1 through a touch operation. The touch operation may be performed using a part of the user's body, a stylus pen, or the like. For example, the touch sensing element may sense at least one of information about whether a touch has been made, information about a touch position, information about the magnitude of touch pressure, and information about the shape of an object performing a touch function among the information input by the user.

In some embodiments, the functional member 600 may be a laminated structure of a plurality of layers.

The first bonding layer 530 may be interposed between the functional member 600 and the upper coating layer 412. The first bonding layer 530 may contact a lower surface of the functional member 600 and the upper coating layer 412. The first bonding layer 530 may include an optical clear adhesive such as a double-sided tape, an optical clear resin such as a photocurable resin or a thermosetting resin, or a pressure sensitive adhesive. The upper coating layer 412 between the encapsulation substrate 200 and the first bonding layer 530 may contribute to the improvement of bond strength between the encapsulation substrate 200 and the first bonding layer 530.

The cover glass 700 may be disposed on the functional member 600. The cover glass 700 may form an upper surface of the display device 1. The cover glass 700 may protect the elements inside the display device 1, form a display surface of the display device 1 on which an image is formed, and may form the exterior of the display device 1. In some embodiments in which the functional member 600 is a touch sensing element, the cover glass 700 may form a touch surface on which a user's touch operation, that is, a touch operation performed by a user is carried out. The cover glass 700 may include a material having high light transmittance and excellent strength such as a glass material, a sapphire material, or a polymer material.

A second bonding layer 550 may be interposed between the cover glass 700 and the functional member 600. The second bonding layer 550 may contact a lower surface of the cover glass 700 and an upper surface of the functional member 600. Like the first bonding layer 530, the second bonding layer 550 may include an optical clear adhesive such as a double-sided tape, an optical clear resin such as a photocurable resin or a thermosetting resin, or a pressure sensitive adhesive. The second bonding layer 550 may include the same or different material from the first bonding layer 530.

The housing 800 may be disposed on a back surface of the light emitting substrate 100. The housing 800 may have an inner space in which the light emitting substrate 100 and/or the encapsulation substrate 200 can be housed or accommodated. That is, the housing 800 may be a back cover, a back chassis, or a bracket. For example, the housing 800 may include a bottom portion 810 which covers the back surface of the light emitting substrate 100 and side portions 830 which protrude upward the bottom portion 810 to cover side surfaces of the light emitting substrate 100 and/or the encapsulation substrate 200. The side portions 830 of the housing 800 may protect the base 110 of the light emitting substrate 100 and the encapsulation substrate 200 by covering side surfaces of the base 100 of the light emitting substrate 100 and the encapsulation substrate 200. The side portions 830 of the housing 800 may protect the functional member 600 and the cover glass 700 by at least partially covering side surfaces of the functional member 600 and the cover glass 700. The bottom portion 810 of the housing 800 may be spaced apart from the base 110, and the side portions 830 of the housing 800 may be spaced apart from the base 110 of the light emitting substrate 100, the encapsulation substrate 200 and the cover glass 700. However, the present disclosure is not limited to this case. The material of the housing 800 is not particularly limited as long as it is a material having excellent strength and rigidity. For example, the housing 800 may include a polymer material such as carbonate resin or a metal material such as aluminum, nickel or an alloy of these metals.

The cushion member 900 may be disposed on the side surfaces of the encapsulation substrate 200. The cushion member 900 may be disposed between the encapsulation substrate 200 and the side portions 830 of the housing 800 to prevent the encapsulation substrate 200 from being damaged by the housing 800. For example, when the encapsulation substrate 200 is distorted or an external impact is applied to the display device 1, the cushion member 900 may maintain the distance between the encapsulation substrate 200 and the housing 800 and absorb at least part of the impact, thereby minimizing damage.

The cushion member 900 may cover the side surfaces of the encapsulation substrate 200 and may be shaped like a substantially quadrilateral band in plan view. The cushion member 900 may contact the encapsulation substrate 200, the first bonding layer 530, the functional member 600, the second bonding layer 550, the cover glass 700, and/or the side portions 830 of the housing 800. For example, the cushion member 900 may be coupled to the encapsulation substrate 200, but may be separable from the housing 800.

By aligning the side surfaces of the encapsulation substrate 200, the functional member 600 and the cover glass 700 and maintaining the distance between the encapsulation substrate 200 and the housing 800 using the cushion member 900, it is possible to protect the light emitting substrate 100, the encapsulation substrate 200 and the frit 310 from external impact and minimize a width of the non-display area NA of the display device 1. The material of the cushion member 900 is not particularly limited as long as it can absorb at least part of impact. For example, the cushion member 900 may include an organic material such as acrylic resin, epoxy resin, imide resin, or acrylate resin.

As described above, the display device 1 according to the current embodiment may include the lower coating layer 411 and the upper coating layer 412 disposed on the surface of the encapsulation substrate 200.

Specifically, the encapsulation substrate 200 including a glass material, the glass frit 310, and the lower coating layer 411 interposed between the encapsulation substrate 200 and the frit 310 may form a glass stack. That is, according to the present disclosure, it is possible to provide a glass stack having improved adhesion between a first glass piece (e.g., an encapsulation substrate) and a second glass piece (e.g., a glass frit). The lower coating layer 411 including a compound having an intramolecular *—$(OCH_2CH_2)_n$—OH structure or an intramolecular *—$(OCH_2CH_2)$—OH structure may contribute to the improvement of bond strength between the first glass piece (e.g., the encapsulation substrate) and the second glass piece (e.g., the glass frit). Accordingly, the glass stack according to the current embodiment may exhibit excellent bond strength.

In addition, the encapsulation substrate 200 including a glass material, the first bonding layer 530 including an organic material, and the upper coating layer 412 interposed between the encapsulation substrate 200 and the first bonding layer 530 may form a glass-resin stack. That is, according to the present disclosure, it is possible to provide a glass-resin stack having improved adhesion between glass and resin. The upper coating layer 412 including a compound having an intramolecular *—$(OCH_2CH_2)_n$—OH structure or an intramolecular *—$(OCH_2CH_2)$—OH structure may contribute to the improvement of bond strength between the encapsulation substrate 200 and the first bonding layer 530. Accordingly, the glass-resin stack according to the present embodiment may exhibit excellent bond strength.

Hereinafter, other embodiments will be described. For simplicity, a description of elements identical to those of the display device 1 according to the above-described embodiment will be omitted, and the identical elements will be clearly understood by those skilled in the art from the accompanying drawings.

Figure 4:
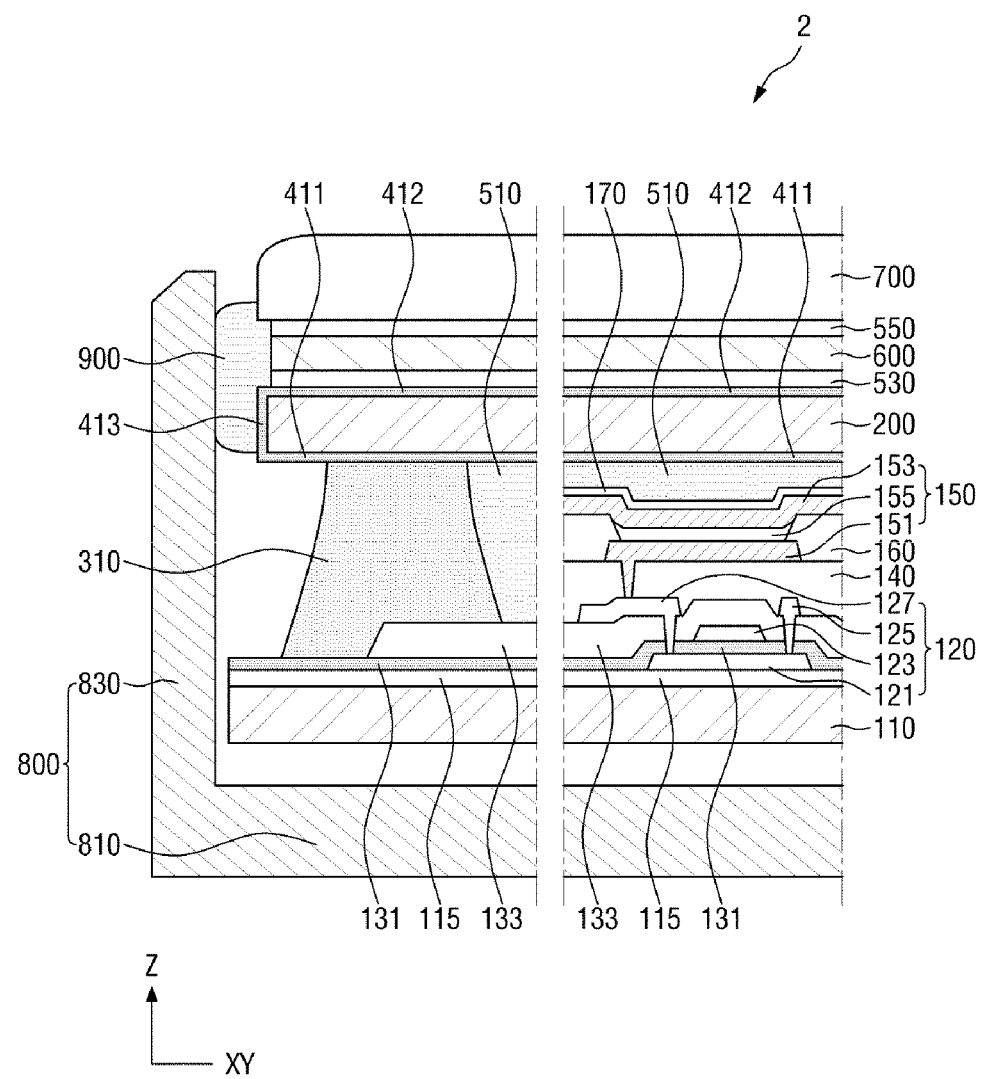
FIG. 4 is a cross-sectional view of a display device according to an embodiment.
Figure 5:
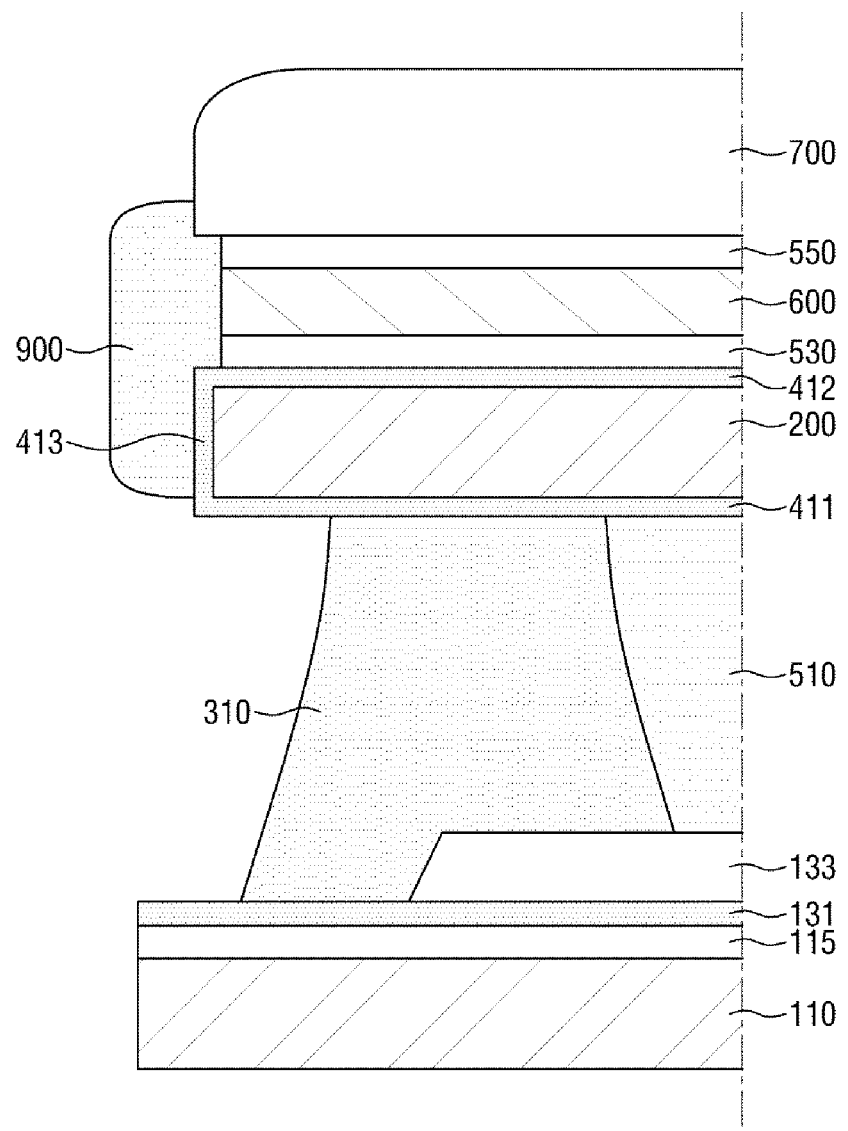
FIG. 5 is an enlarged cross-sectional view of the non-display area of the display device of FIG. 4.

FIG. 4 is a cross-sectional view of a display device 2 according to an embodiment, illustrating a display area where a light emitting element 150 of the display device 2 is disposed and a non-display area where a frit 310 is disposed. FIG. 5 is an enlarged cross-sectional view of the non-display area of the display device 2 of FIG. 4.

Referring to FIGS. 4 and 5, the display device 2 according to the current embodiment is different from the display device 1 according to the embodiment of FIG. 2, etc. in that it further includes a side coating layer 413 disposed on side surfaces of an encapsulation substrate 200.

In an embodiment, the side coating layer 413 may be disposed between the encapsulation substrate 200 and a cushion member 900. For example, the side coating layer 413 may be disposed directly on the side surfaces of the encapsulation substrate 200. The side coating layer 413 may contribute to the improvement of bond strength between the encapsulation substrate 200 and the cushion member 900. The side coating layer 413 may include the same compound as a lower coating layer 411 and an upper coating layer 412. For example, the side coating layer 413 may be a self-aligned layer formed by self-alignment of the above-described compound having an intramolecular *—$(OCH_2CH_2)_n$—OH structure or an intramolecular *—$(OCH_2CH_2)$—OH structure. The self-aligned compound having the hydroxyl groups may form a physical/chemical bond with fluorine groups on the side surfaces of the encapsulation substrate 200. A physical boundary that is visible with the naked eye may not substantially exist between the side coating layer 413 and the lower coating layer 411 and between the side coating layer 413 and the upper coating layer 412.

Like the lower coating layer 411 and the upper coating layer 412, the side coating layer 413 may have alkalinity. A maximum thickness of the side coating layer 413 may be, but is not limited to, about 10 μm or less.

In an embodiment, the side coating layer 413 may include a different compound from the lower coating layer 411 and the upper coating layer 412.

The cushion member 900 may be disposed on the side coating layer 413. The cushion member 900 may contact the side coating layer 413, a first bonding layer 530, a functional member 600, a second bonding layer 550, a cover glass 700 and/or side portions 830 of a housing 800.

In the display device 2 according to the current embodiment, the encapsulation substrate 200 including a glass material, the cushion member 900 including an organic material, and the side coating layer 413 interposed between the encapsulation substrate 200 and the cushion member 900 may form a glass-resin stack.

Figure 6:
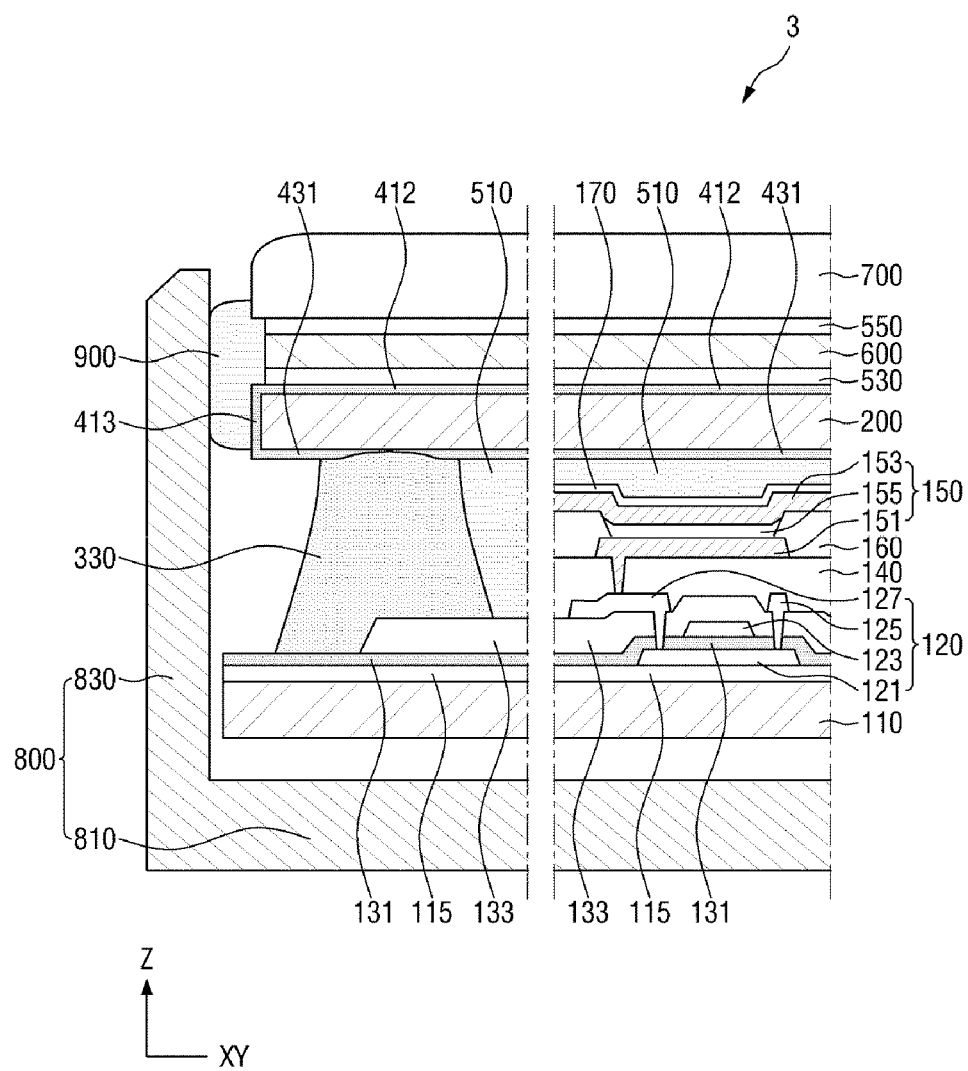
FIG. 6 is a cross-sectional view of a display device according to an embodiment.
Figure 7:
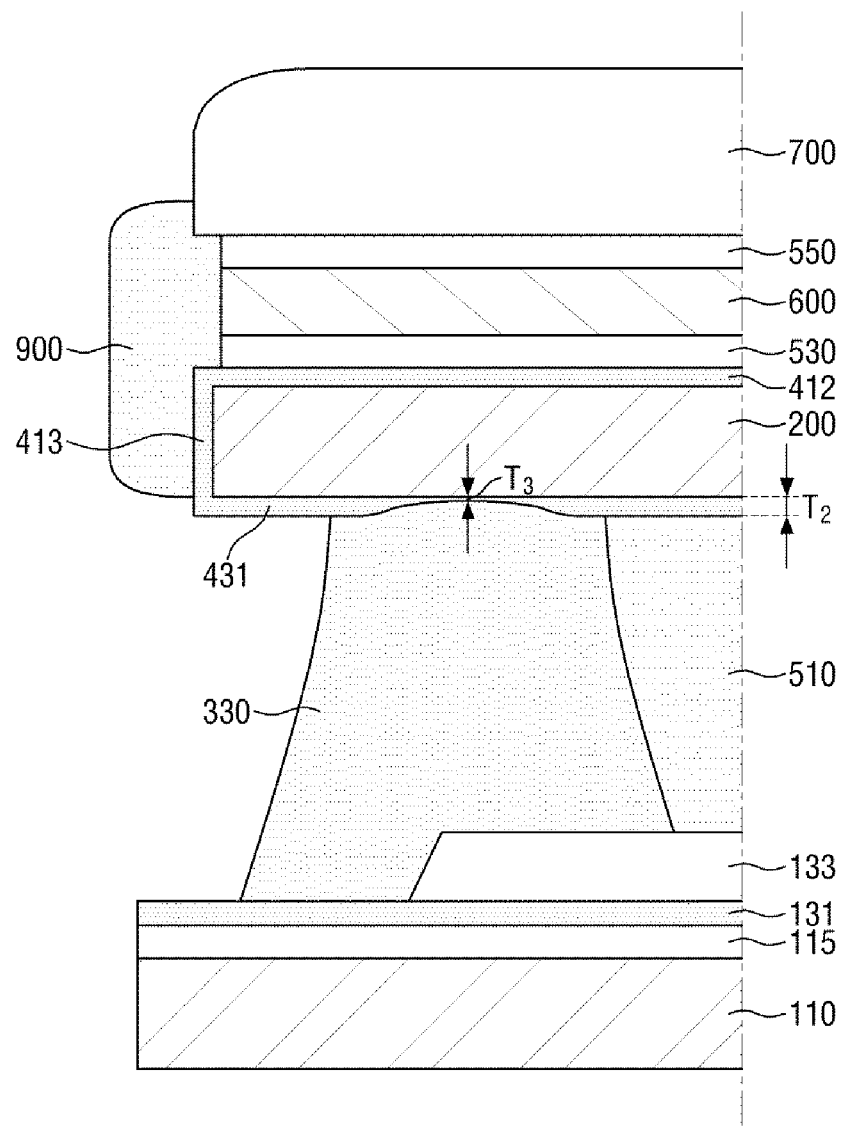
FIG. 7 is an enlarged cross-sectional view of the non-display area of the display device of FIG. 6.

FIG. 6 is a cross-sectional view of a display device 3 according to an embodiment, illustrating a display area where a light emitting element 150 of the display device 3 is disposed and a non-display area where a frit 330 is disposed. FIG. 7 is an enlarged cross-sectional view of the non-display area of the display device 3 of FIG. 6.

Referring to FIGS. 6 and 7, the display device 3 according to the current embodiment is different from the display device 2 according to the embodiment of FIG. 4, etc. in that a lower coating layer 431 has a partially different thickness.

The lower coating layer 431 may overlap the light emitting element 150 in the display area and the frit 330 in the non-display area in the third direction Z. In an embodiment, an average thickness of the lower coating layer 431 overlapping the light emitting element 150 may be greater than an average thickness of the lower coating layer 431 overlapping the frit 330. For example, a first thickness $T_2$ of the lower coating layer 431 overlapping the light emitting element 150 in the display area may be substantially uniform. The first thickness $T_2$ may be about 10 μm or less.

On the other hand, a thickness of the lower coating layer 431 overlapping the frit 330 in the non-display area may be partially non-uniform. For example, a portion of the lower coating layer 431 which overlaps the frit 330 may have a second thickness $T_3$ smaller than the first thickness $T_2$. In a more specific example, a portion of the lower coating layer 431 which contacts the frit 330 may have the second thickness $T_3$. An upper limit of the second thickness $T_3$ may be about 5.0 μm, about 4.0 μm, about 3.0 μm, about 2.0 μm, or about 1.0 μm. Therefore, an inclined surface may be formed on part of a surface of the lower coating layer 431.

The lower coating layer 431 which contacts the frit 330 of the display device 3 according to the current embodiment may have a partially non-uniform thickness. In particular, the lower coating layer 431 contacting the frit 330 may be formed relatively thin so that the lower coating layer 431 can form a partially inclined surface while a compound having an intramolecular *—(OCH$_2$CH$_2$)$_n$—OH structure or an intramolecular *—(OCH$_2$CH$_2$)—OH structure is stably maintained in a self-aligned state. The inclined surface of the lower coating layer 431 may increase the area of a bonding interface between the frit 330 and the lower coating layer 431, thereby further improving the bond strength formed by the frit 330.

In addition, the inclined surface of the lower coating layer 431 may increase a path length of the bonding interface between the frit 330 and the lower coating layer 431, thereby increasing a length of a penetration path of impurities such as moisture or air.

In an embodiment, a side coating layer 413 may be omitted, and a cushion member 900 may contact an encapsulation substrate 200.

Figure 8:
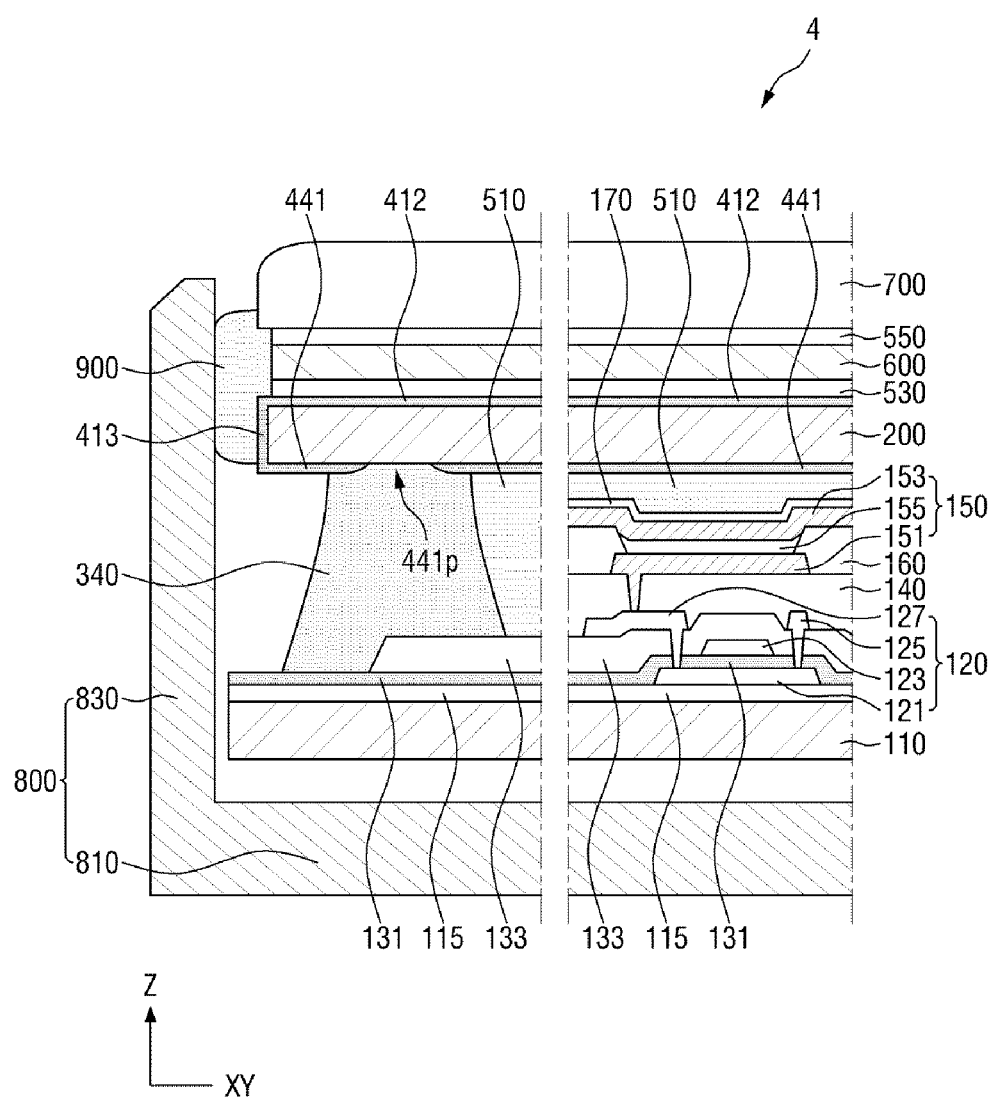
FIG. 8 is a cross-sectional view of a display device according to an embodiment.
Figure 9:
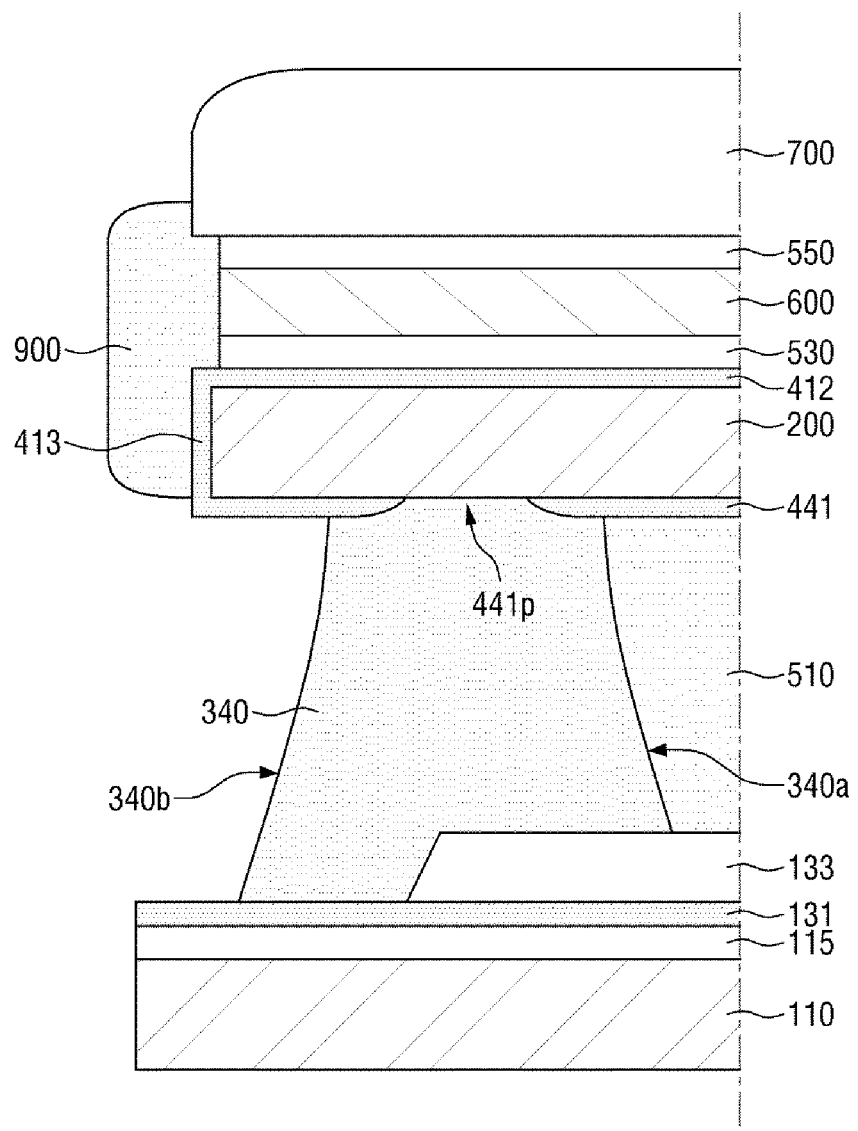
FIG. 9 is an enlarged cross-sectional view of the non-display area of the display device of FIG. 8.

FIG. 8 is a cross-sectional view of a display device 4 according to an embodiment, illustrating a display area where a light emitting element 150 of the display device 4 is disposed and a non-display area where a frit 340 is disposed. FIG. 9 is an enlarged cross-sectional view of the non-display area of the display device 4 of FIG. 8.

Referring to FIGS. 8 and 9, the display device 4 according to the current embodiment is different from the display device 2 according to the embodiment of FIG. 4, etc. in that at least a portion of the frit 340 contacts an encapsulation substrate 200.

In an embodiment, a lower coating layer 441 may have an opening 441p that at least partially exposes a back surface of the encapsulation substrate 200. The opening 441p of the lower coating layer 441 may be formed in the process of forming the frit 340 by melting and curing a frit composition or frit paste, but the present disclosure is not limited to this case. In an embodiment in which a laser is irradiated to form the frit 340, the opening 441p of the lower coating layer 441 may be controlled by the type of laser, the position of laser focus, laser irradiation intensity, or laser irradiation time.

Also, the frit 340 may at least partially contact the lower coating layer 441 and may further contact the encapsulation substrate 200 exposed by the opening 441p. For example, an approximately central portion of an upper surface of the frit 340 may contact the encapsulation substrate 200 in plan view.

On the other hand, each of an inner edge portion formed by the upper surface and inner side surface 340a of the frit 340 and an outer edge portion formed by the upper surface and outer side surface 340b of the frit 340 may contact the lower coating layer 441. In plan view, when the frit 340 is formed to surround the light emitting elements 150, the inner side surface 340a of the frit 340 may be a side surface on the side of the light emitting elements 150, and the outer side surface 340b of the frit 340 may be a side surface opposite the inner side surface 340a.

When an impact is applied from the outside of the display device 4, stress tray be concentrated on a bonding surface formed by the frit 340, thereby damaging the bonding surface. In particular, the stress due to the external impact may be primarily transferred to the inner edge portion and the outer edge portion of the frit 340. However, since the inner edge portion and the outer edge portion of the frit 340 that are most vulnerable to damage due to the stress are formed to contact the lower coating layer 441, the bonding strength can be improved. In addition, since the frit 340 and the encapsulation substrate 200 are formed to partially contact each other, a bonding interface may be formed between the frit 340 and the encapsulation substrate 200, and the penetration of impurities such as moisture or air through the bonding interface formed between the frit 340 and the encapsulation substrate 200 in contact with each other can be effectively prevented.

In an embodiment, a side coating layer 413 may be omitted, and a cushion member 900 may contact the encapsulation substrate 200.

Figure 10:
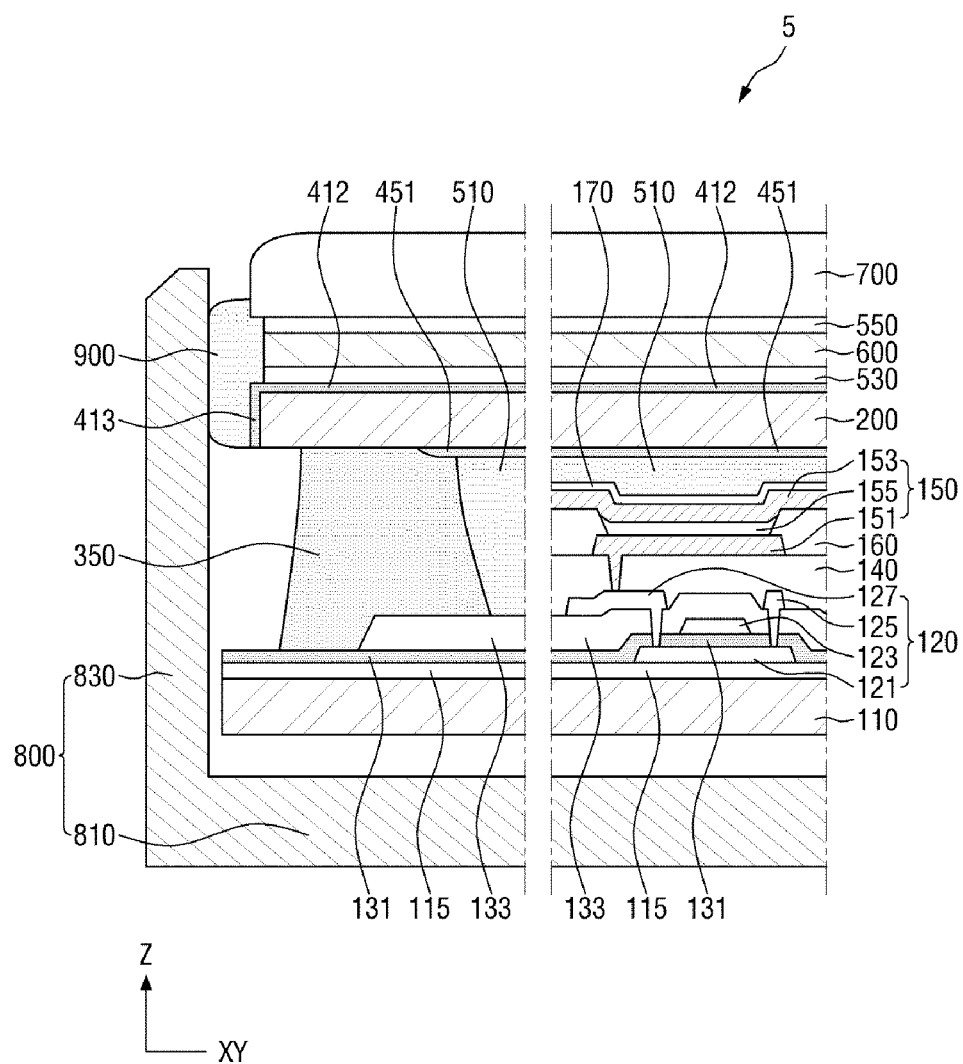
FIG. 10 is a cross-sectional view of a display device according to an embodiment.
Figure 11:
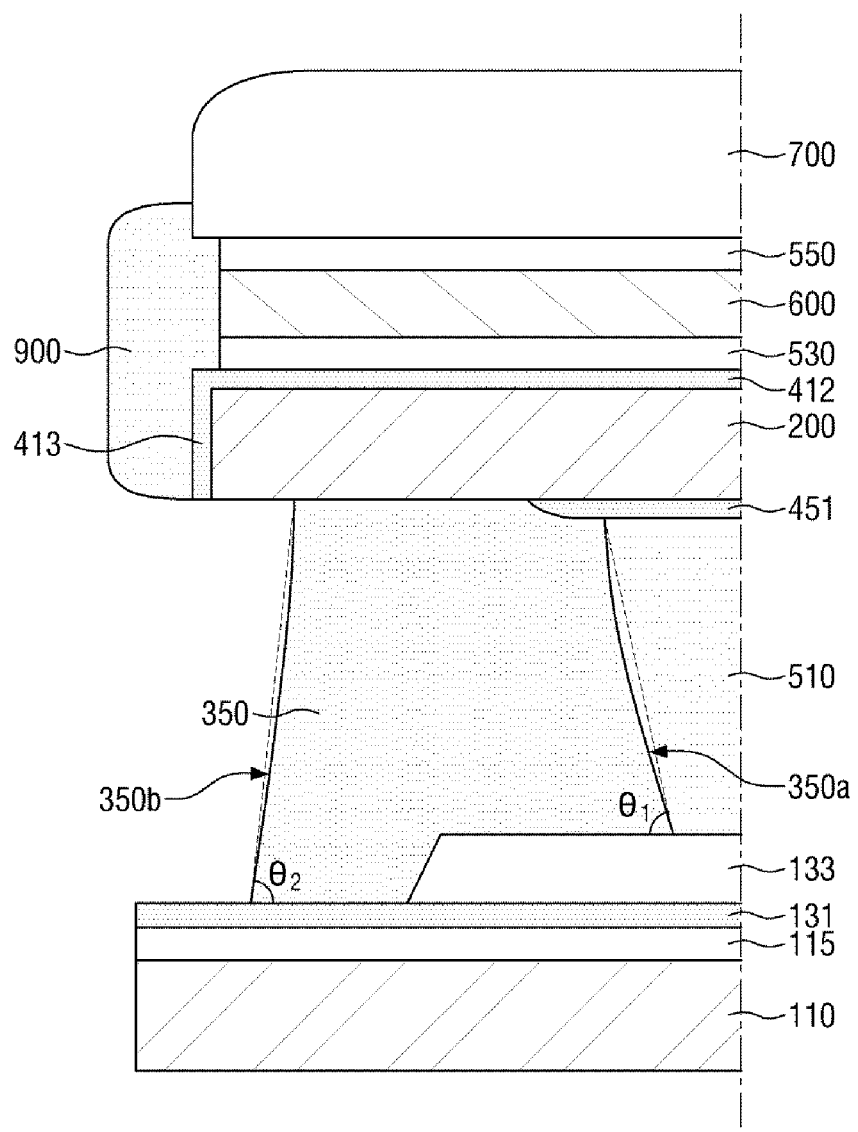
FIG. 11 is an enlarged cross-sectional view of the non-display area of the display device of FIG. 10.

FIG. 10 is a cross-sectional view of a display device 5 according to an embodiment, illustrating a display area where a light emitting element 150 of the display device 5 is disposed and a non-display area where a frit 350 is disposed. FIG. 11 is an enlarged cross-sectional view of the non-display area of the display device 5 of FIG. 10.

Referring to FIGS. 10 and 11, the display device 5 according to the current embodiment is different from the display device 2 according to the embodiment of FIG. 4, etc. in that an outer edge portion of the frit 350 contacts an encapsulation substrate 200.

In an embodiment, a lower coating layer 451 may be disposed on a back surface of the encapsulation substrate 200, but may not be disposed in an edge region of the back surface of the encapsulation substrate 200 in plan view. A region where the lower coating layer 451 is not disposed may be controlled in the process of forming the frit 350, but the present disclosure is not limited to this case. In an embodiment in which a laser is irradiated to form the frit 350, the region where the lower coating layer 451 of the frit 350 is not disposed may be controlled by, for example, the laser irradiation position.

The frit 350 may at least partially contact the lower coating layer 451 and may further contact the encapsulation substrate 200 uncovered by the lower coating layer 451.

An inner edge portion formed by an upper surface and an inner side surface 350a of the frit 350 may contact the lower coating layer 451. On the other hand, the outer edge portion formed by an approximately central portion of the upper surface of the frit 350, the upper surface of the frit 350, and an outer side surface 350b of the frit 350 may contact the encapsulation substrate 200.

When an impact is applied from the outside of the display device 5, stress may be concentrated on a bonding surface formed by the fit 350, thereby damaging the bonding surface. In particular, the bonding surface may be relatively more vulnerable to damage near the inner edge portion of the frit 350 than near the outer edge portion of the frit 350. However, since the inner edge portion is formed to contact the lower coating layer 451 in the display device 5 according to the current embodiment, the bonding strength can be improved. In addition, since the frit 350 and the encapsulation substrate 200 are formed to partially contact each other, specifically, since the outer edge portion of the frit 350 and the central portion of the upper surface of the frit 350 are formed to contact the encapsulation substrate 200, a bonding interface may be formed between the frit 350 and the encapsulation substrate 200, and the penetration of impurities such as moisture or air through the bonding interface formed between the frit 350 and the encapsulation substrate 200 in contact with each other can be effectively prevented.

In some embodiments, an average inclination angle $\theta_1$ of the inner side surface 350a of the frit 350 and an average inclination angle $\theta_2$ of the outer side surface 350b of the frit 350 may be different. For example, the average inclination angle $\theta_1$ of the inner side surface 350a of the frit 350 and the average inclination angle $\theta_2$ of the outer side surface 350b of the frit 350 may all be 90 degrees or less, but the average inclination angle $\theta_1$ of the inner side surface 350a of the frit 350 may be smaller than the average inclination angle $\theta_2$ of the outer side surface 350b of the frit 350. In a more specific example, the average inclination angle $\theta_1$ of the inner side surface 350a of the frit 350 may be about 60 degrees to about 80 degrees, and the average inclination angle $\theta_2$ of the outer side surface 350b of the frit 350 may be about 65 degrees to about 88 degrees. The inclination angles $\theta_1$ and $\theta_2$ of the inner side surface 350a and the outer side surface 350b of the frit 350 may be controlled in the process of melting and curing a frit composition or frit paste, but the present disclosure is not limited to this case. In an embodiment in which a laser is irradiated to form the frit 350, the inclination angles $\theta_1$ and $\theta_2$ of the inner side surface 350a and the outer side surface 350b of the frit 350 may be controlled by, for example, the laser irradiation position.

In an embodiment, a side coating layer 413 may be omitted, and a cushion member 900 may contact the encapsulation substrate 200.

Figure 12:
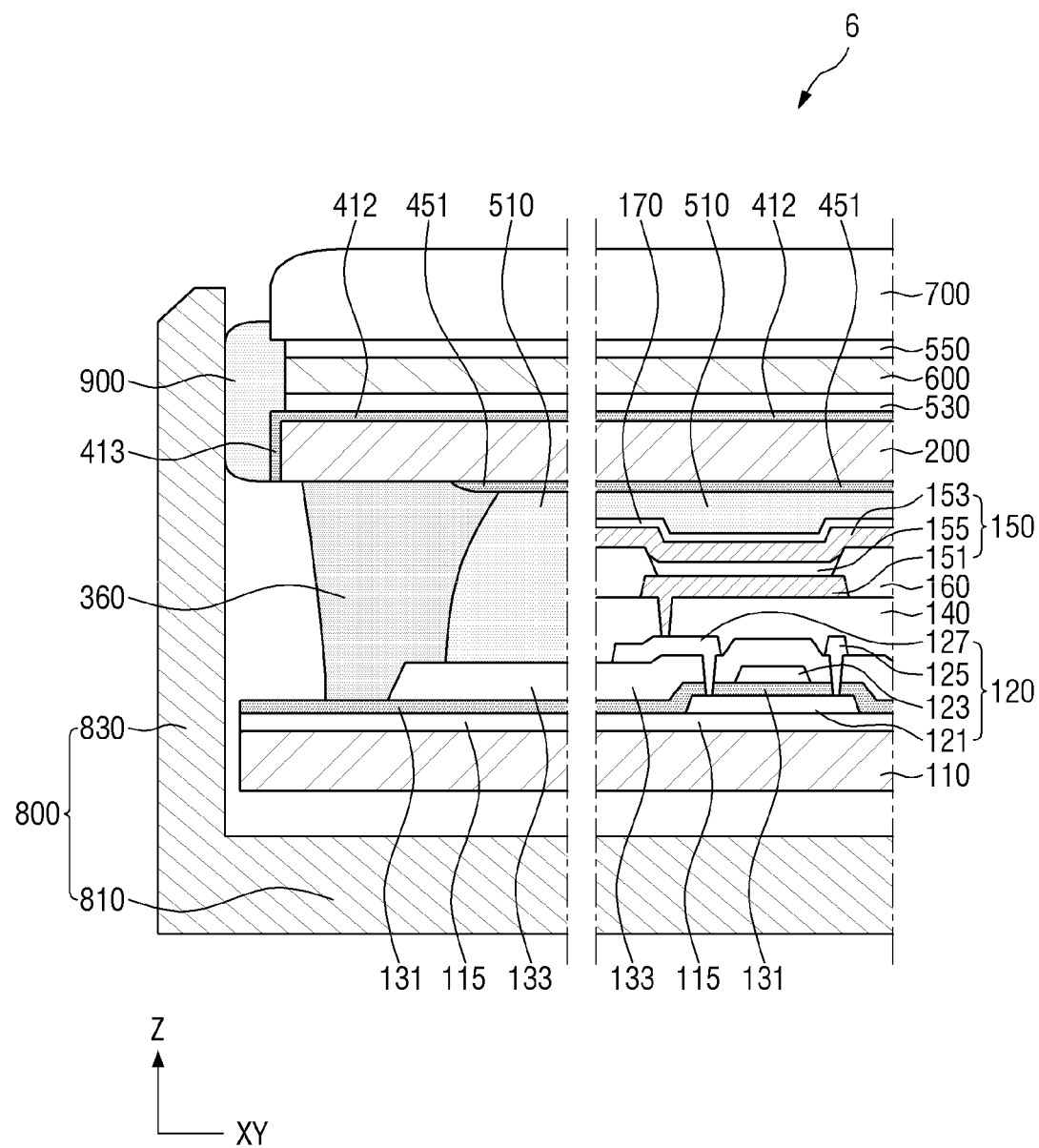
FIG. 12 is a cross-sectional view of a display device according to an embodiment.
Figure 13:
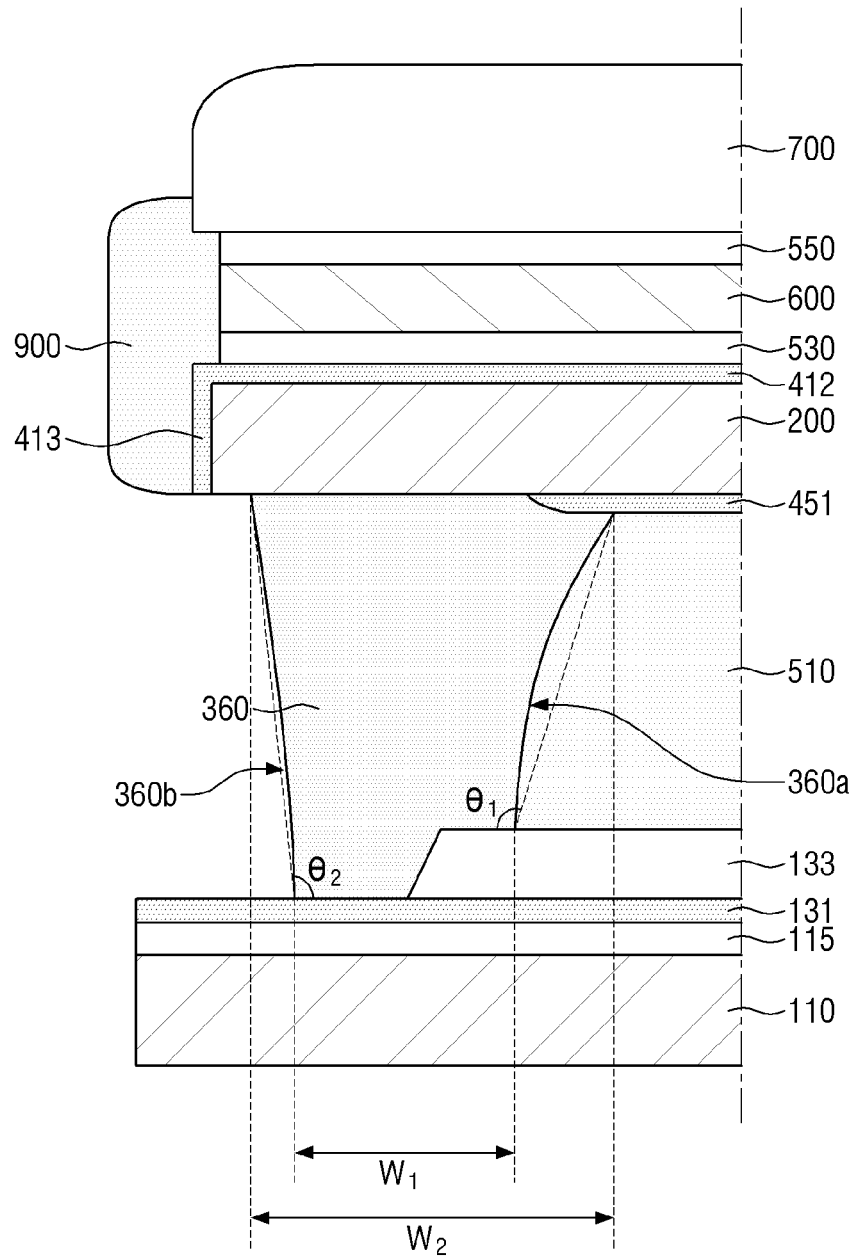
FIG. 13 is an enlarged cross-sectional view of the non-display area of the display device of FIG. 12.

FIG. 12 is a cross-sectional view of a display device 6 according to an embodiment, illustrating a display area where a light emitting element 150 of the display device 6 is disposed and a non-display area where a frit 360 is disposed. FIG. 13 is an enlarged cross-sectional view of the non-display area of the display device 6 of FIG. 12.

Referring to FIGS. 12 and 13, the display device 6 according to the current embodiment is different from the display device 5 according to the embodiment of FIG. 10, etc. in that the frit 360 has inclined surfaces and a lower width $W_1$ of the frit 360, for example, a width $W_1$ of the frit 360 on the side of a light emitting substrate is smaller than an upper width $W_2$ of the frit 360, for example, a width $W_2$ of the frit 360 on the side of an encapsulation substrate 200.

In an embodiment, an average inclination angle $\theta_1$ of an inner side surface 360a of the frit 360 and an average inclination angle $\theta_2$ of an outer side surface 360b of the frit 360 may be different. For example, the average inclination angle $\theta_1$ of the inner side surface 360a of the frit 360 and the average inclination angle $\theta_2$ of the outer side surface 360b of the frit 360 may all be 90 degrees or more, but the average inclination angle $\theta_1$ of the inner side surface 360a of the frit 360 may be greater than the average inclination angle $\theta_2$ of the outer side surface 360b of the frit 360. The inclination angles $\theta_1$ and $\theta_2$ of the inner side surface 360a and the outer side surface 360b of the frit 360 may be controlled in the process of melting and curing a frit composition or frit paste, but the present disclosure is not limited to this case.

In an embodiment, a side coating layer 413 may be omitted, and a cushion member 900 may contact the encapsulation substrate 200.

Hereinafter, a method of manufacturing a display device according to the present disclosure will be described. FIGS. 14 through 23 are cross-sectional views illustrating a method of manufacturing a display device according to an embodiment.

Figure 14:
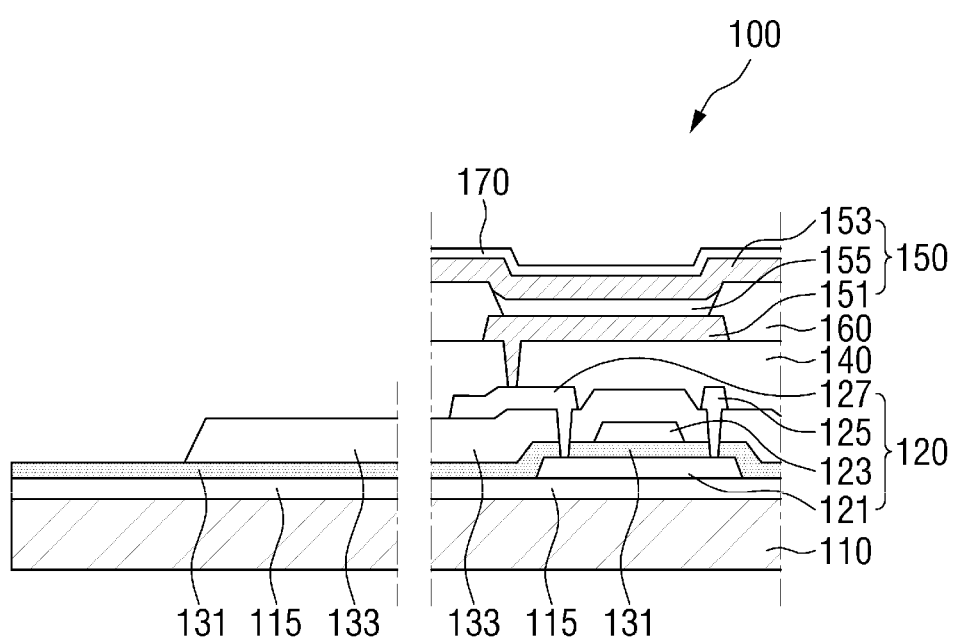
FIGS. 14 through 23 are cross-sectional views illustrating a method of manufacturing a display device according to an embodiment.

First, referring to FIG. 14, a light emitting substrate 100 including a base 110, a thin-film transistor 120, a light emitting element 150, and a protective layer 170 is prepared. Since the elements of the light emitting substrate 100 have been described above, a redundant description thereof is omitted.

Figure 15:
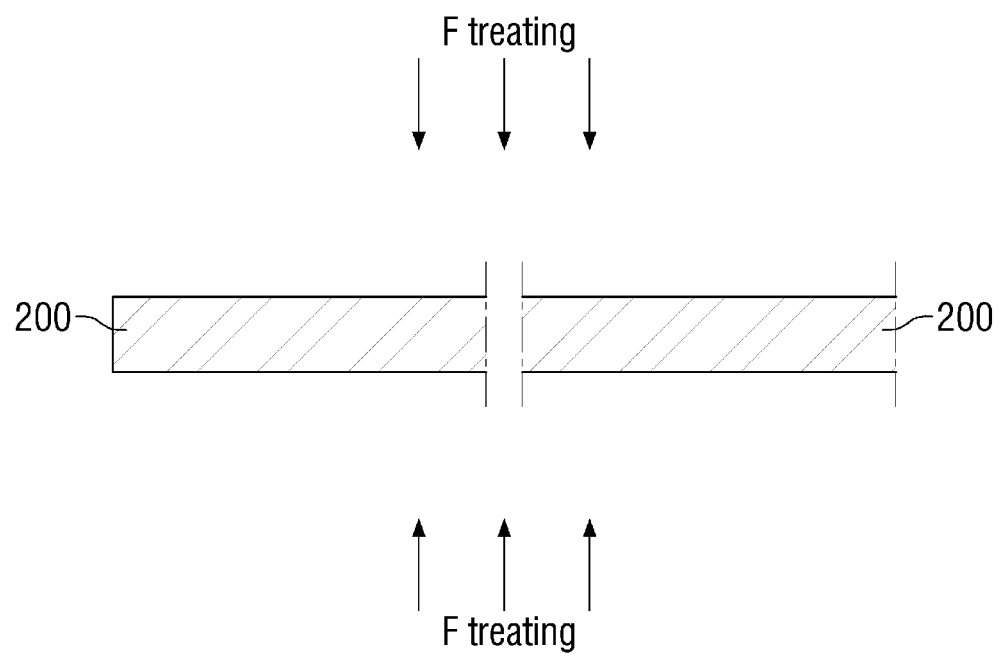

Next, referring to FIG. 15, a surface of the encapsulation substrate 200 is treated with fluorine. A first surface (a lower surface in FIG. 15) and a second surface (an upper surface in FIG. 15) of the encapsulation substrate 200 are treated with fluorine to form fluorine groups (—F) on the first and second surfaces of the encapsulation substrate 200. In some embodiments, side surfaces of the encapsulation substrate 200 may also be treated with fluorine.

Figure 16:
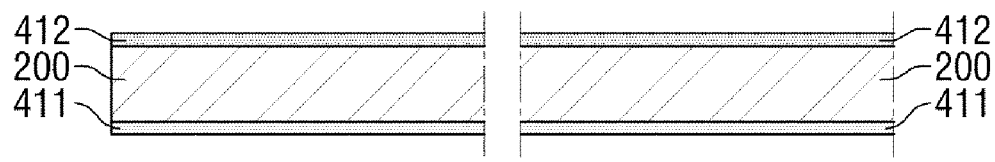

Next, referring to FIG. 16, the encapsulation substrate 200 having lower and upper coating layers 411 and 412 formed on at least a portion of its surface is prepared.

In an embodiment, the preparing of the encapsulation substrate 200 having the lower and upper coating layers 411 and 412 may include forming the lower coating layer 411 on the fluorine group-containing first surface (the lower surface in FIG. 15) of the encapsulation substrate 200, forming the upper coating layer 412 on the fluorine group-containing second surface (the upper surface in FIG. 15) of the encapsulation substrate 200, and washing and drying the encapsulation substrate 200 having the lower coating layer 411 and the upper coating layer 412.

The forming of the lower coating layer 411 may include self-aligning single molecules having a self-aligning property or a self-assembling property directly on the encapsulation substrate 200. In an embodiment, the lower coating layer 411 may be a coating layer formed by self-alignment of a compound having an intramolecular *—(OCH$_2$CH$_2$)$_n$—OH structure or an intramolecular *—(OCH$_2$CH$_2$)—OH structure. Since the above compound has been described above, a redundant description thereof is omitted.

In addition, the forming of the upper coating layer 412 may include self-aligning single molecules having a self-aligning property or a self-assembling property directly on the encapsulation substrate 200. The upper coating layer 412 may include the same compound as the lower coating layer 411, and thus a redundant description thereof is omitted. In some embodiments, the lower coating layer 411 and the upper coating layer 412 may be simultaneously formed through a single process.

The washing and drying of the encapsulation substrate 200 having the lower coating layer 411 and the upper coating layer 412 may include washing the encapsulation substrate 200 using distilled water or deionized water and drying the washed encapsulation substrate 200 using an air knife. The lower coating layer 411 and upper coating layer 412 that are substantially water-insoluble may be stabilized in the process of being washed by an aqueous medium. That is, since the encapsulation substrate 200 is washed after the lower coating layer 411 and the upper coating layer 412 are formed on the encapsulation substrate 200, the lower coating layer 411 and the upper coating layer 412 can be made more solid.

Figure 17:
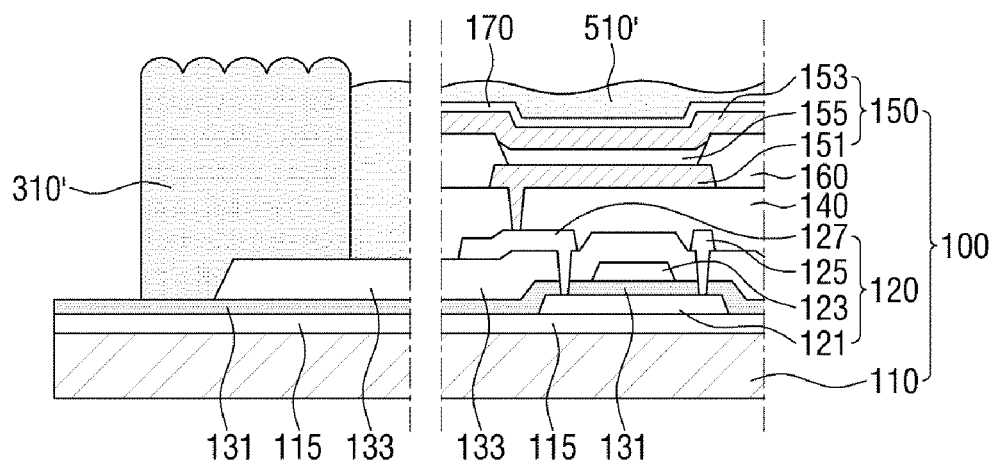

Next, referring to FIG. 17, a frit composition 310' and a filler composition 510' are provided on the light emitting substrate 100 and are heat-treated.

The providing of the frit composition 310' may be an operation of applying the frit composition 310' onto the light emitting substrate 100. The applying method is not particularly limited, but, e.g., screen printing may be used. The frit composition 310' may be provided in a substantially quadrilateral band shape along edges of the light emitting substrate 100. The frit composition 310' may include vanadium oxide and further include a ceramic filler or an organic material and may be in a paste or gel state.

The heat-treating of the frit composition 310' may be an operation of pre-curing the frit composition 310' in the paste or gel state to a solid state by baking the frit composition 310'. The frit composition 310' pre-cured or baked through heat treatment may be temporarily fixed on the light emitting substrate 100 in a substantially solid state. In this operation, the organic material in the frit composition 310' may be removed through deterioration, but the present disclosure is not limited to this case. In addition, the heat-treating of the filler composition 510' may be an operation of curing the filler composition 510'. The heat treatment temperature of the frit composition 310' and the filler composition 510' may be about 300° C. to about 500° C. or about 350° C. to about 450° C. In addition, the heat treatment operation may be performed under a nitrogen atmosphere.

In FIG. 17, the frit composition 310' and the filler composition 510' are provided on the light emitting substrate 100 and are treated with heat. However, the present disclosure is not limited to this case. In an embodiment, the frit composition 310' and/or the filler composition 510' may be provided on the encapsulation substrate (not illustrated).

In an embodiment, the providing of the filler composition 510' may be omitted, and a space surrounded by the light emitting substrate 100, the encapsulation substrate 200, and a frit 310 to be described later may be filled with an inert gas such as nitrogen gas (N$_2$).

Figure 18:
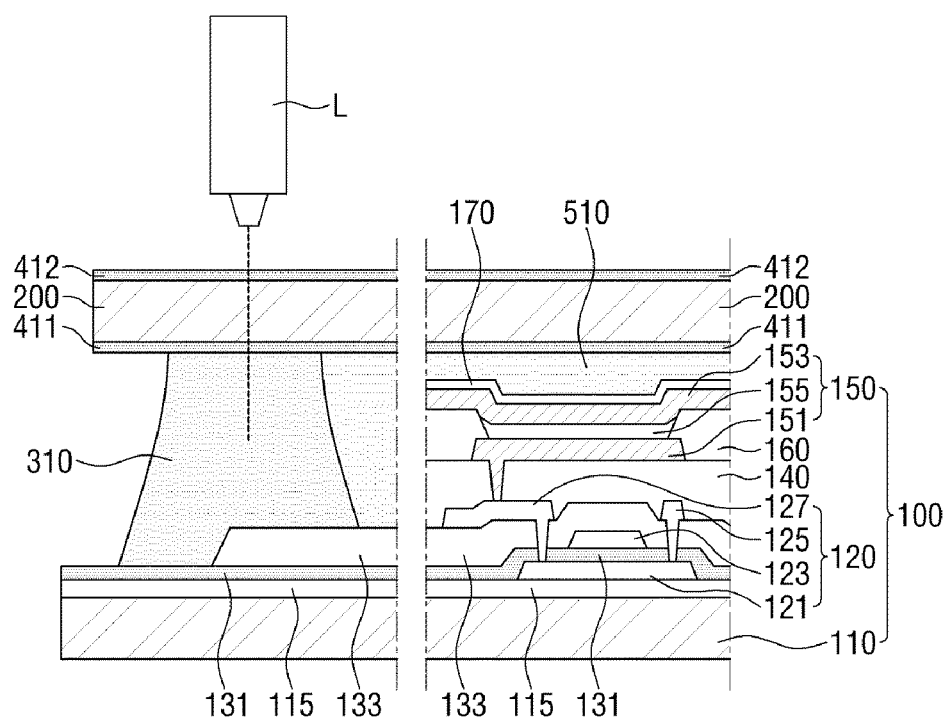

Next, referring to FIG. 18, the frit 310 is formed between the light emitting substrate 100 and the encapsulation substrate 200 to bond the light emitting substrate 100 and the encapsulation substrate 200 together. In an embodiment, the forming of the frit 310 may include aligning the light emitting substrate 100 and the encapsulation substrate 200 and forming the frit 310 by melting and curing the heat-treated frit composition 310'.

The aligning of the light emitting substrate 100 and the encapsulation substrate 200 may be an operation of aligning the light emitting substrate 100 and the encapsulation substrate 200 such that the frit composition 310' pre-cured or baked through heat treatment overlaps the lower coating layer 411 and the upper coating layer 412.

In addition, the melting and curing of the heat-treated frit composition 310' may include irradiating a laser L to the frit composition 310' pre-cured or baked through heat treatment. The laser L irradiated to the heat-treated frit composition 310' may melt the frit composition 310'. The frit composition 310' melted after being irradiated with the laser L may be cured or re-cured to form the frit 310. The laser L may be irradiated to the frit composition 310' sequentially via the upper coating layer 412, the encapsulation substrate 200, and the lower coating layer 411.

The frit 310 may contact a first insulating layer 131 and a second insulating layer 133 of the light emitting substrate 100 and the lower coating layer 411 to form a bonding interface. As described above, the lower coating layer 411 between the encapsulation substrate 200 and the frit 310 may contribute to the improvement of bond strength between the encapsulation substrate 200 and the frit 310.

The laser L may have a wavelength of about 760 nm to about 860 nm or about 780 nm to about 830 nm. In an embodiment in which the frit composition 310' is provided in a substantially quadrilateral band shape, the laser L may be irradiated while being moved along the shape of the frit composition 310' which is temporarily fixed as a result of being pre-cured or baked. The energy distribution of the laser L may have a flat shape, not a Gaussian distribution, but the present disclosure is not limited to this case.

In some embodiments, the side surfaces of the encapsulation substrate 200 may be exposed after the light emitting substrate 100 and the encapsulation substrate 200 are bonded together.

Figure 19:
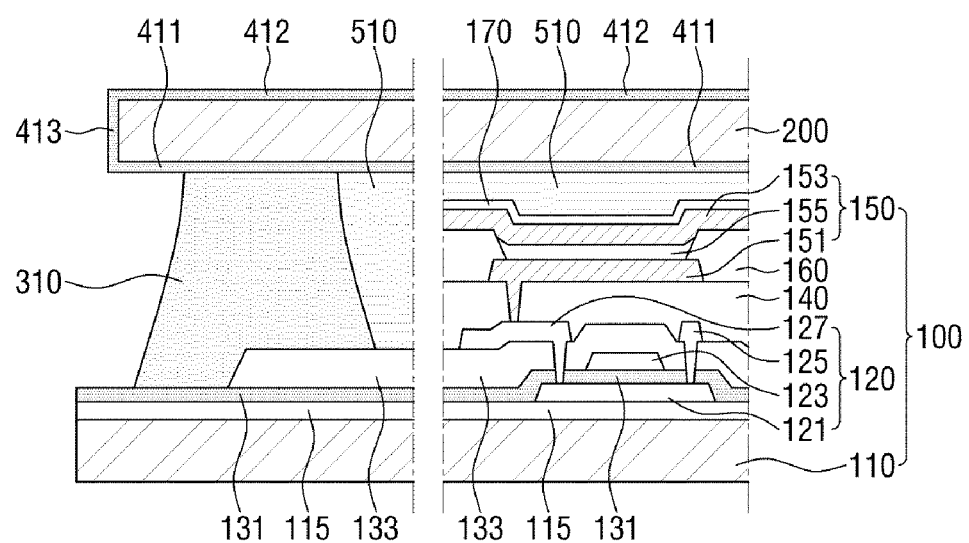

Next, referring to FIG. 19, a side coating layer 413 is formed on the side surfaces of the encapsulation substrate 200. The forming of the side coating layer 413 may include self-aligning single molecules having a self-aligning property or a self-assembling property directly on the side surfaces of the encapsulation substrate 200. The side coating layer 413 may include the same compound as the lower coating layer 411 and the upper coating layer 412, that is, the compound having the intramolecular *—(OCH$_2$CH$_2$)$_n$—OH structure or the intramolecular *—(OCH$_2$CH$_2$)—OH structure. Thus, a redundant description of the compound of the side coating layer 413 is omitted.

In some embodiments, after the forming of the side coating layer 413, the method of manufacturing a display device may further include partially washing and drying the light emitting substrate 100 and the encapsulation substrate 200 bonded together. The washing and drying of the light emitting substrate 100 and the encapsulation substrate 200 may include washing the light emitting substrate 100 and the encapsulation substrate 200 using distilled water or deionized water and drying the light emitting substrate 100 and the encapsulation substrate 200 using an air knife.

Figure 20:
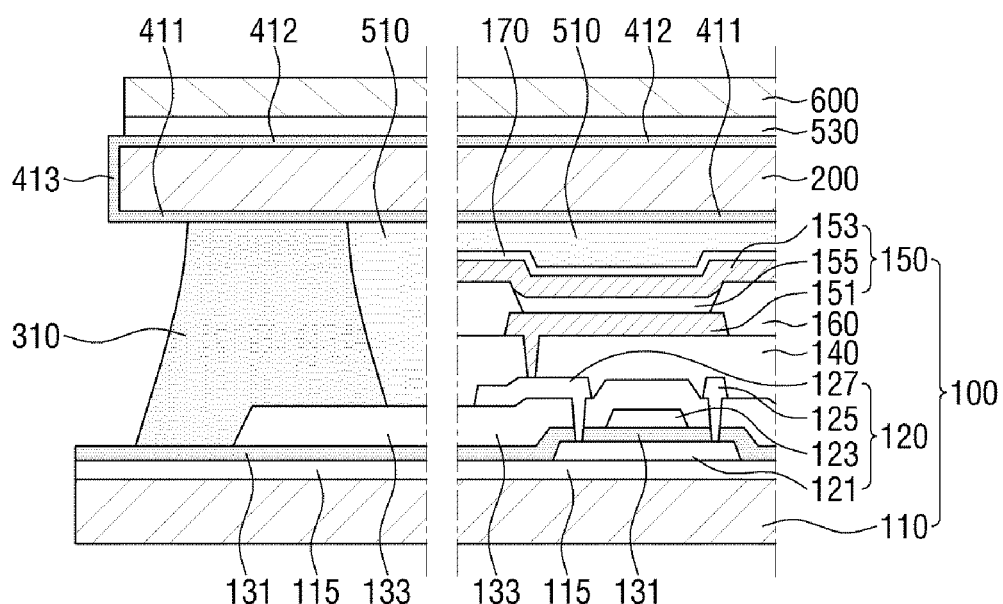

Next, referring to FIG. 20, a functional member 600 is formed on the encapsulation substrate 200 with a first bonding layer 530 interposed between the functional member 600 and the encapsulation substrate 200. Since the first bonding layer 530 and the functional member 600 have been described above, a redundant description thereof is omitted.

Figure 21:
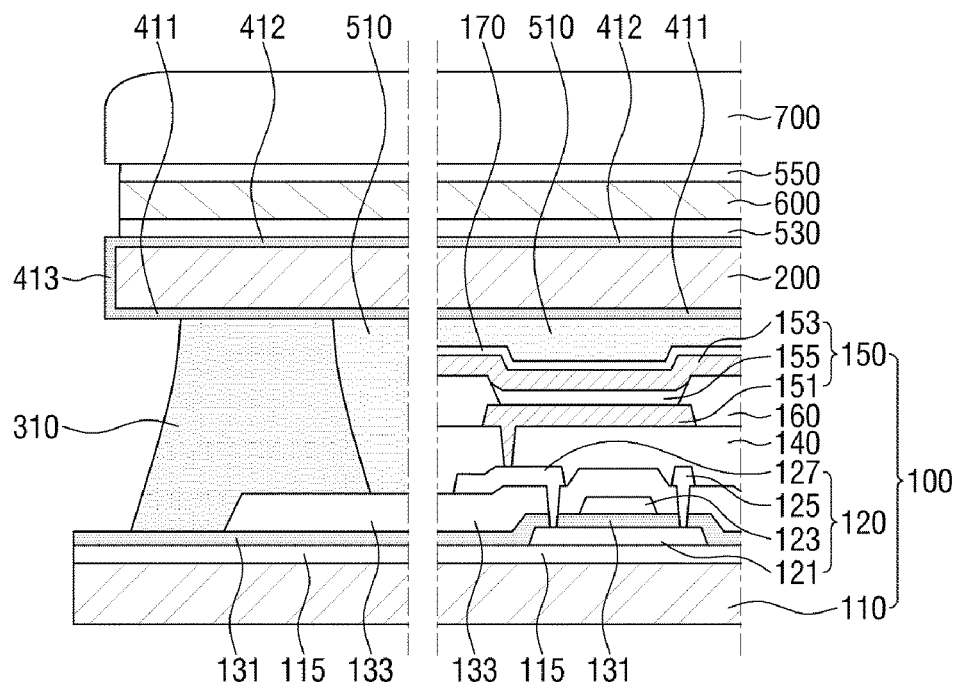

Next, referring to FIG. 21, a cover glass 700 is formed on the functional member 600 with a second bonding layer 550 interposed between the cover glass 700 and the functional member 600. Since the second bonding layer 550 and the cover glass 700 have been described above, a redundant description thereof is omitted.

Figure 22:
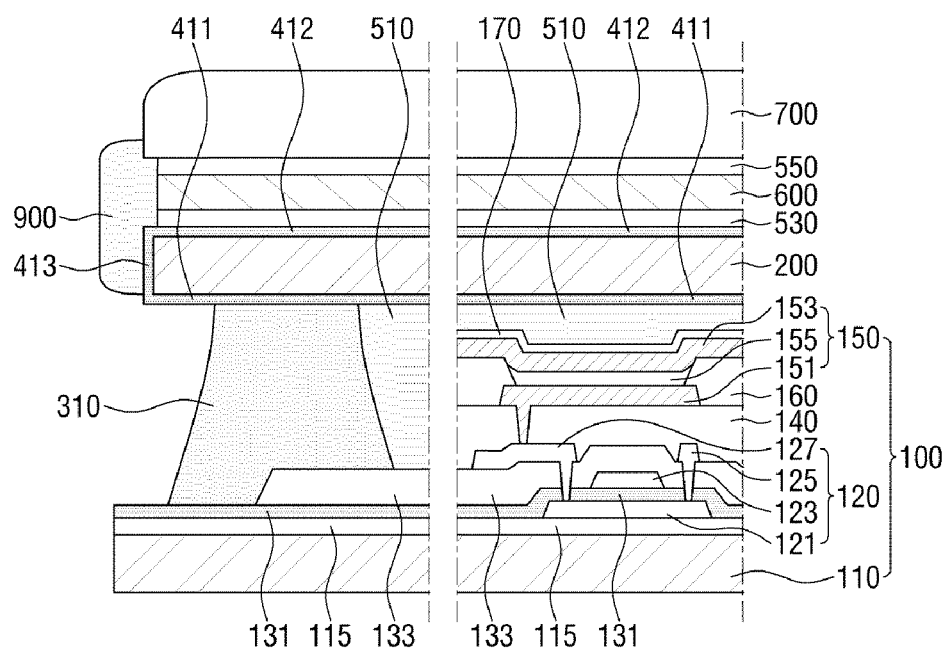

Referring to FIG. 22, a cushion member 900 is formed. The cushion member 900 may be disposed on the side surfaces of the encapsulation substrate 200. For example, the cushion member 900 may at least partially contact the side coating layer 413, the first bonding layer 530, the functional member 600, the second bonding layer 550, and the cover glass 700. Since the cushion member 900 has been described above, a redundant description thereof is omitted.

Figure 23:
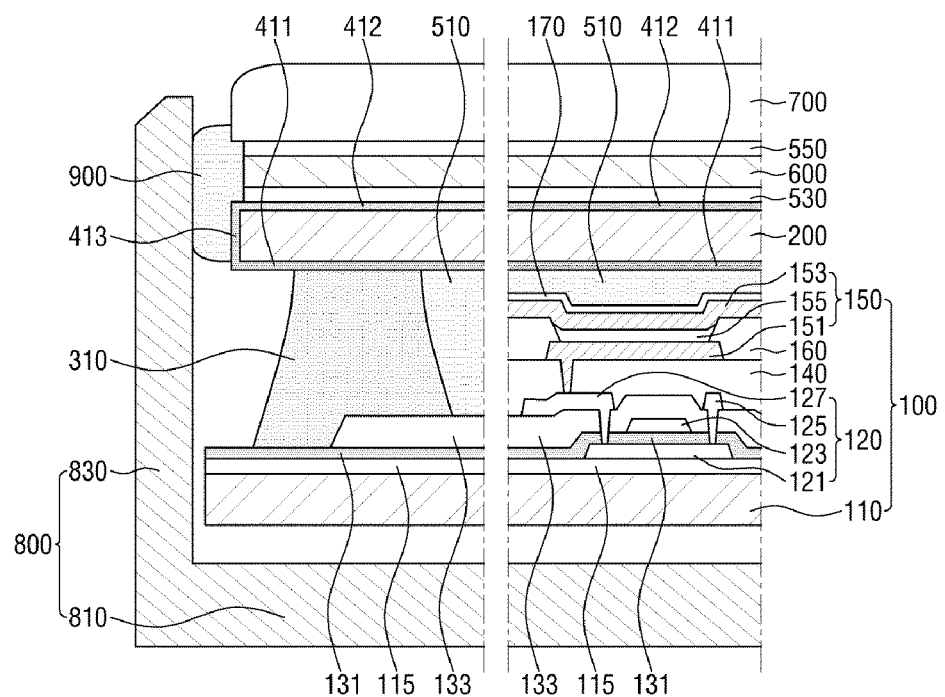

Referring to FIG. 23, the light emitting substrate 100 and the encapsulation substrate 200 are inserted into a housing 800. Since the housing 800 has been described above, a redundant description thereof is omitted.

According to embodiments, a coating layer capable of improving bond strength is interposed between an encapsulation substrate or a glass and a frit to improve the bond strength between the encapsulation substrate or the glass and the frit. Thus, a display device with improved durability and reliability can be provided.

However, the effects of the embodiments are not restricted to the one set forth herein. The above and other effects of the embodiments will become more apparent to one of daily skill in the art to which the embodiments pertain by referencing the claims.

What is claimed is:

1. A display device comprising:
   a light emitting substrate which comprises a base and a light emitting element disposed on the base;
   an encapsulation substrate which is disposed on the light emitting substrate;
   a frit which surrounds the light emitting element and is disposed between the light emitting substrate and the encapsulation substrate; and
   a first coating layer which is disposed between the encapsulation substrate and the frit, and comprises a compound having an intramolecular *—(OCH$_2$CH$_2$)—OH structure, and at least partially contacting the frit.

2. The display device of claim 1, wherein the first coating layer is disposed directly on a first surface of the encapsulation substrate which faces the light emitting substrate, and fluorine groups (—F) are present on the first surface of the encapsulation substrate which contacts the first coating layer.

3. The display device of claim 1, wherein the first coating layer has alkalinity.

4. The display device of claim 1, wherein the first coating layer is a self-aligned layer of the compound, and a maximum thickness of the first coating layer is about 10 µm or less.

5. The display device of claim 1, wherein the first coating layer overlaps the light emitting element and the frit.

6. The display device of claim 5, wherein an average thickness of the first coating layer overlapping the light emitting element is greater than an average thickness of the first coating layer overlapping the frit.

7. The display device of claim 1, wherein at least a portion of the frit contacts the encapsulation substrate.

8. The display device of claim 7, wherein a central portion of an upper surface of the frit contacts the encapsulation substrate in plan view.

9. The display device of claim 8, wherein the frit has an inner side surface on the side of the light emitting element and an outer side surface opposite the inner side surface, wherein an inner edge portion formed by the upper surface and the inner side surface of the frit contacts the first coating layer, and an outer edge portion formed by the upper surface and the outer side surface of the frit contacts the encapsulation substrate.

10. The display device of claim 9, wherein a width of the frit on the side of the light emitting substrate is different from a width of the frit on the side of the encapsulation substrate, and an average inclination angle of the inner side surface of the frit is different from an average inclination angle of the outer side surface of the frit.

11. The display device of claim 1, further comprising a second coating layer which is disposed on a second surface of the encapsulation substrate and is a self-aligned layer, the second surface facing away from the light emitting substrate.

12. The display device of claim 11, wherein the second coating layer is disposed directly on the second surface of the encapsulation substrate, overlaps the light emitting element and the frit, and comprises the same compound as the first coating layer.

13. The display device of claim 11, further comprising:
   a functional member which is disposed on the second coating layer and comprises a polarizing element or a touch sensing element; and
   a bonding layer which is disposed between the second coating layer and the function member and contacts the second coating layer and the functional member.

14. The display device of claim 13, further comprising a third coating layer which is disposed directly on side surfaces of the encapsulation substrate and is a self-aligned layer of a compound having an intramolecular *—(OCH$_2$CH$_2$)—OH structure.

15. The display device of claim 14, further comprising:
   a cover glass which is disposed on the functional member;
   a housing which houses the light emitting substrate and the encapsulation substrate and has sidewall portions covering the side surfaces of the encapsulation substrate; and
   a cushion member which is disposed between the third coating layer and the sidewall portions of the housing and comprises an organic material,
   wherein the cushion member contacts the third coating layer, the bonding layer, the functional member, and the cover glass.

16. A method of manufacturing a display device, the method comprising:
   preparing a light emitting substrate which comprises a base and a light emitting element disposed on the base;
   preparing an encapsulation substrate, on at least a portion of a surface of which a coating layer comprising a compound having an intramolecular *—(OCH$_2$CH$_2$)—OH structure is formed;
   forming a frit for bonding the light emitting substrate and the encapsulation substrate together between the light emitting substrate and the encapsulation substrate to at least partially contact the coating layer formed on the encapsulation substrate.

17. The method of claim 16, wherein the coating layer comprises a first coating layer which is disposed on a first surface of the encapsulation substrate and a second coating layer which is disposed on a second surface of the encapsulation substrate, and the preparing of the encapsulation substrate having the coating layer comprises:
   treating the first and second surfaces of the encapsulation substrate with fluorine;
   forming the first coating layer by self-aligning the compound directly on the first surface of the encapsulation substrate;
   forming the second coating layer by self-aligning the compound directly on the second surface of the encapsulation substrate; and
   washing and drying the encapsulation substrate having the first coating layer and the second coating layer.

18. The method of claim 16, wherein the forming of the frit comprises:
   providing a frit composition on the light emitting substrate;
   treating the frit composition with heat;
   aligning the encapsulation substrate such that the heat-treated frit composition and the coating layer overlap each other; and
   melting and curing the heat-treated frit composition by irradiating a laser to the heat-treated frit composition,
   wherein the coating layer comprises a first coating layer formed on a first, surface of the encapsulation which faces the light emitting substrate and a second coating layer formed on a second surface of the encapsulation substrate, the second surface facing away from the light emitting substrate, and the irradiating of the laser comprises irradiating the laser to be sequentially transmitted through the second coating layer, the encapsulation substrate and the first coating layer.

19. Me method of claim 16, further comprising, after the forming of the frit:
   forming a third coating layer, which comprises a compound having an intramolecular *—$(OCH_2CH_2)$—OH structure, on side surfaces of the encapsulation substrate;
   placing a functional member, which comprises a polarizing element or a touch sensing element, on the encapsulation substrate having the third coating layer;
   placing a cover glass on the functional member; and
   placing a cushion member, which comprises an organic material, on the third coating layer to contact the third coating layer, the functional member and the cover glass.

* * * * *